United States Patent [19]
Ikegaya et al.

[11] Patent Number: 5,103,105
[45] Date of Patent: Apr. 7, 1992

[54] APPARATUS FOR INSPECTING SOLDER PORTION OF A CIRCUIT BOARD

[75] Inventors: Kazutoshi Ikegaya, Zama; Yuji Maruyama, Tokyo; Yukifumi Tsuda, Kawasaki; Kunio Sannomiya, Atsugi; Hiroto Toba, Yokohama, all of Japan

[73] Assignee: Matsushita Electric Industrial Co., Ltd., Japan

[21] Appl. No.: 602,573

[22] Filed: Oct. 24, 1990

[30] Foreign Application Priority Data

| Nov. 2, 1989 | [JP] | Japan | 1-287036 |
| Nov. 2, 1989 | [JP] | Japan | 1-287037 |
| Feb. 5, 1990 | [JP] | Japan | 2-25391 |
| Feb. 23, 1990 | [JP] | Japan | 2-43013 |
| May 25, 1990 | [JP] | Japan | 2-135924 |

[51] Int. Cl.[5] .................... G01N 21/86; G01B 11/24
[52] U.S. Cl. ................................. 250/561; 250/563; 356/376; 356/394
[58] Field of Search ............... 250/563, 561, 562, 571, 250/572, 234, 235, 236; 356/376, 394; 382/8; 364/560-564

[56] References Cited

U.S. PATENT DOCUMENTS

| 4,900,940 | 2/1990 | Nakamura | 356/376 |
| 4,910,690 | 3/1990 | Fujita | 356/394 |
| 4,911,550 | 5/1990 | Hisakuni | 356/376 |
| 4,911,551 | 3/1990 | Morander | 356/376 |
| 4,983,827 | 1/1991 | Ikegaya et al. | 250/561 |
| 4,988,202 | 1/1991 | Nayar et al. | 356/376 |
| 5,011,960 | 4/1991 | Ando et al. | 356/376 |

Primary Examiner—David C. Nelms
Assistant Examiner—Michael Messinger
Attorney, Agent, or Firm—Lowe, Price, LeBlanc & Becker

[57] ABSTRACT

A beam of light is applied to a surface of a circuit board provided with at least one solder portion. The light beam scans the surface of the circuit board. Height data are derived from a portion of the light beam which is scattered at the surface of the circuit board. The height data represent a height of a currently-scanned point of the surface of the circuit board. The height data are accumulatively added for the solder portion. A variation in the height data is calculated. The accumulative addition of the height data is executed and suspended in response to the calculated variation in the height data. A decision is made as to whether the solder portion is acceptable or unacceptable on the basis of a result of the accumulative addition.

9 Claims, 19 Drawing Sheets

FIG. 4
(a)
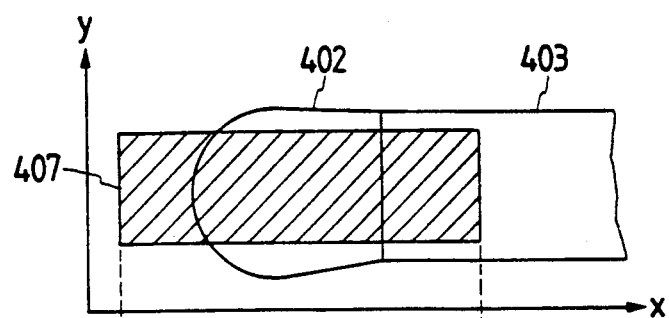
(b)
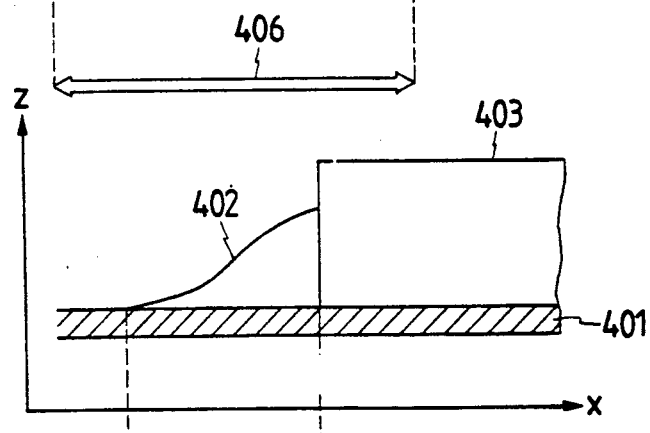
(c)
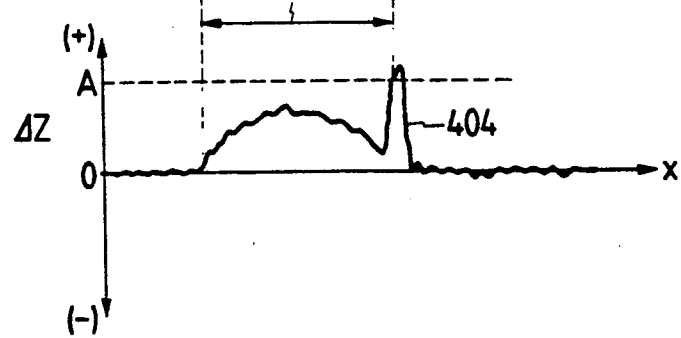

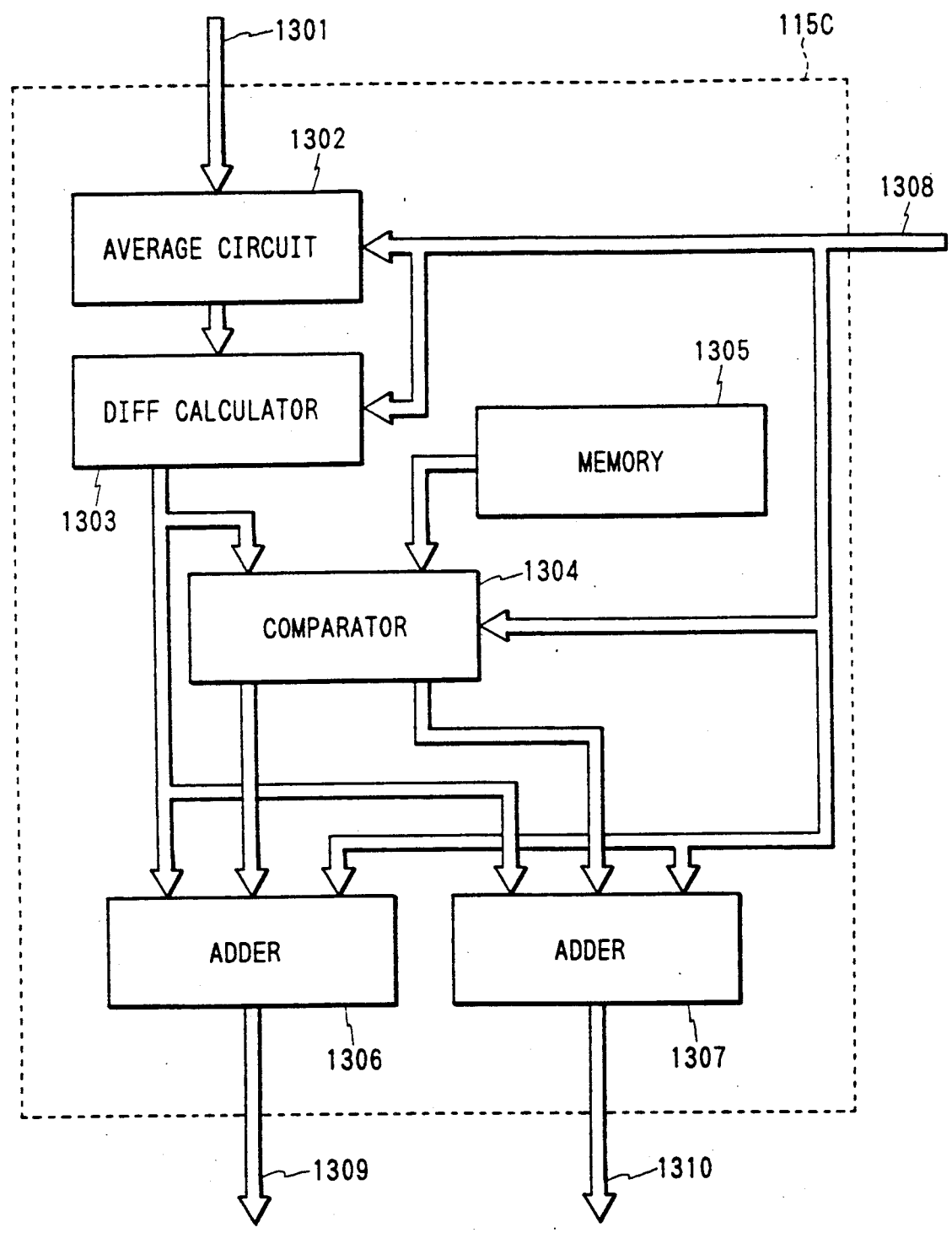

APPARATUS FOR INSPECTING SOLDER PORTION OF A CIRCUIT BOARD

BACKGROUND OF THE INVENTION

This invention generally relates to a circuit board inspecting apparatus, and specifically relates to an apparatus for automatically inspecting solder portions of a printed circuit board.

Japanese published unexamined patent application 1-219548 discloses an apparatus for automatically inspecting solder portions of a printed circuit board by using the fact that a good solder portion and a defective solder portion exhibit different accumulative frequency distributions of luminance. The apparatus of Japanese application 1-219548 has a two-dimensional camera to generate data representing luminances of the solder portions of the printed circuit board. An accumulative frequency distribution of luminance is derived from the luminance data. The solder portions of the printed circuit board are checked by analyzing the accumulative frequency distribution of luminance.

SUMMARY OF THE INVENTION

It is an object of this invention to provide an improved circuit board inspecting apparatus.

A first aspect of this invention provides an apparatus for inspecting a circuit board provided with at least one solder portion, the apparatus comprising means for emitting a beam of light; means for applying the light beam to a surface of the circuit board; means for allowing the light beam to scan the surface of the circuit board; means for deriving height data from a portion of the light beam which is scattered at the surface of the circuit board, the height data representing a height of a currently-scanned point of the surface of the circuit board; means for accumulatively adding the height data for the solder portion; means for calculating a variation in the height data; means for executing and suspending the accumulatively adding by the adding means in response to the calculated variation in the height data; and means for deciding whether the solder portion is acceptable or unacceptable on the basis of a result of the accumulatively adding by the adding means.

A second aspect of this invention provides an apparatus for inspecting a circuit board provided with at least one solder portion, the apparatus comprising means for emitting a beam of light; means for applying the light beam to a surface of the circuit board; means for allowing the light beam to scan the surface of the circuit board; means for deriving height data from a portion of the light beam which is scattered at the surface of the circuit board, the height data representing a height of a currently-scanned point of the surface of the circuit board; means for calculating a differential of the height data for the solder portion; and means for deciding whether the solder portion is acceptable or unacceptable on the basis of the calculated differential of the height data.

A third aspect of this invention provides an apparatus for inspecting a circuit board provided with at least one solder portion, the apparatus comprising means for emitting a beam of light; means for applying the light beam to a surface of the circuit board; means for allowing the light beam to scan the surface of the circuit board; means for deriving height data from a portion of the light beam which is scattered at the surface of the circuit board, the height data representing a height of a currently-scanned point of the surface of the circuit board; means for calculating a differential of the height data, and generating differential data representing the calculated differential of the height data, wherein differential data and corresponding height data compose general data; means for calculating a first number of the general data lying in a predetermined acceptable two-dimensional region for the solder portion, the acceptable region being defined by a first predetermined height range and a first predetermined differential range; means for calculating a second number of the general data lying in a predetermined unacceptable two-dimensional region for the solder portion, the unacceptable region being defined by a second predetermined height range and a second predetermined differential range; and means for deciding whether the solder portion is acceptable or unacceptable on the basis of the calculated first and second numbers.

A fourth aspect of this invention provides an apparatus for inspecting a circuit board provided with at least one solder portion, the apparatus comprising means for emitting a beam of light; means for applying the light beam to a surface of the circuit board; means for allowing the light beam to scan the surface of the circuit board; means for deriving height data from a portion of the light beam which is scattered at the surface of the circuit board, the height data representing a height of a currently-scanned point of the surface of the circuit board; means for calculating a differential of the height data, and generating differential data representing the calculated differential of the height data, wherein differential data and corresponding height data compose general data; means for calculating a first number of the general data lying in a predetermined acceptable two-dimensional region for the solder portion, the acceptable region being defined by a first predetermined height range and a first predetermined differential range; means for calculating a second number of the general data lying in a predetermined unacceptable two-dimensional region for the solder portion, the unacceptable region being defined by a second predetermined height range and a second predetermined differential range; first adding means for accumulatively adding the height data corresponding to general data lying in the acceptable region; second adding means for accumulatively adding the height data corresponding to general data lying in the unacceptable region; and means for deciding whether the solder portion is acceptable or unacceptable on the basis of the calculated first and second numbers, and results of the accumulatively adding by the first and second adding means.

A fifth aspect of this invention provides an apparatus for inspecting a circuit board provided with at least one solder portion, the apparatus comprising means for emitting a beam of light; means for applying the light beam to a surface of the circuit board; means for allowing the light beam to scan the surface of the circuit board; means for deriving height data from a portion of the light beam which is scattered at the surface of the circuit board, the height data representing a height of a currently-scanned point of the surface of the circuit board; means for deriving luminance data from a portion of the light beam which is scattered at the surface of the circuit board, the luminance data representing a luminance of a currently-scanned point of the surface of the circuit board; means for accumulatively adding the luminance data for the solder portion; means for calculating a variation in the height data; means for executing and suspending the accumulatively adding by the adding means in response to the calculated variation in the height data; and means for deciding whether the solder portion is acceptable or unacceptable on the basis of a result of the accumulatively adding by the adding means.

A sixth aspect of this invention provides an apparatus for inspecting a circuit board provided with at least one solder portion, the appartus comprising means for emitting a beam of light; means for applying the light beam to a surface of the circuit board; means for allowing the light beam to scan the surface of the circuit board; means for deriving height data from a portion of the light beam which is scattered at the surface of the circuit board, the height data representing a height of a currently-scanned point of the surface of the circuit board; means for calculating a differential of the height data, and generating differential data representing the calculated differential of the height data, wherein differential data and corresponding height data compose general data; first detecting means for detecting the general data which lies in a predetermined acceptable two-dimensional region, the acceptable region being defined by a first predetermined height range and a first predetermined differential range; second detecting means for detecting the general data which lies in a predetermined unacceptable two-dimensional region, the unacceptable region being defined by a second predetermined height range and a second predetermined differential range; first adding means responsive to the first detecting means for accumulatively adding the luminance data corresponding to general data lying in the acceptable region for the solder portion; second adding means responsive to the second detecting means for accumulatively adding the luminance data corresponding to general data lying in the unacceptable region for the solder portion; and means for deciding whether the solder portion is acceptable or unacceptable on the basis of results of the accumulatively adding by the first adding means and the second adding means.

BRIEF DESCRIPTION OF THE DRAWINGS

FIGS. 4a, 4b, and 4c are diagrams including a plan view and a sectional view of a printed circuit board, and an illustration of a profile of the differential of height data in the apparatus of FIG. 1.

FIG. 8 is a block diagram of a calculator in an apparatus of a fourth embodiment of this invention.

DESCRIPTION OF THE FIRST PREFERRED EMBODIMENT

Figure 1:
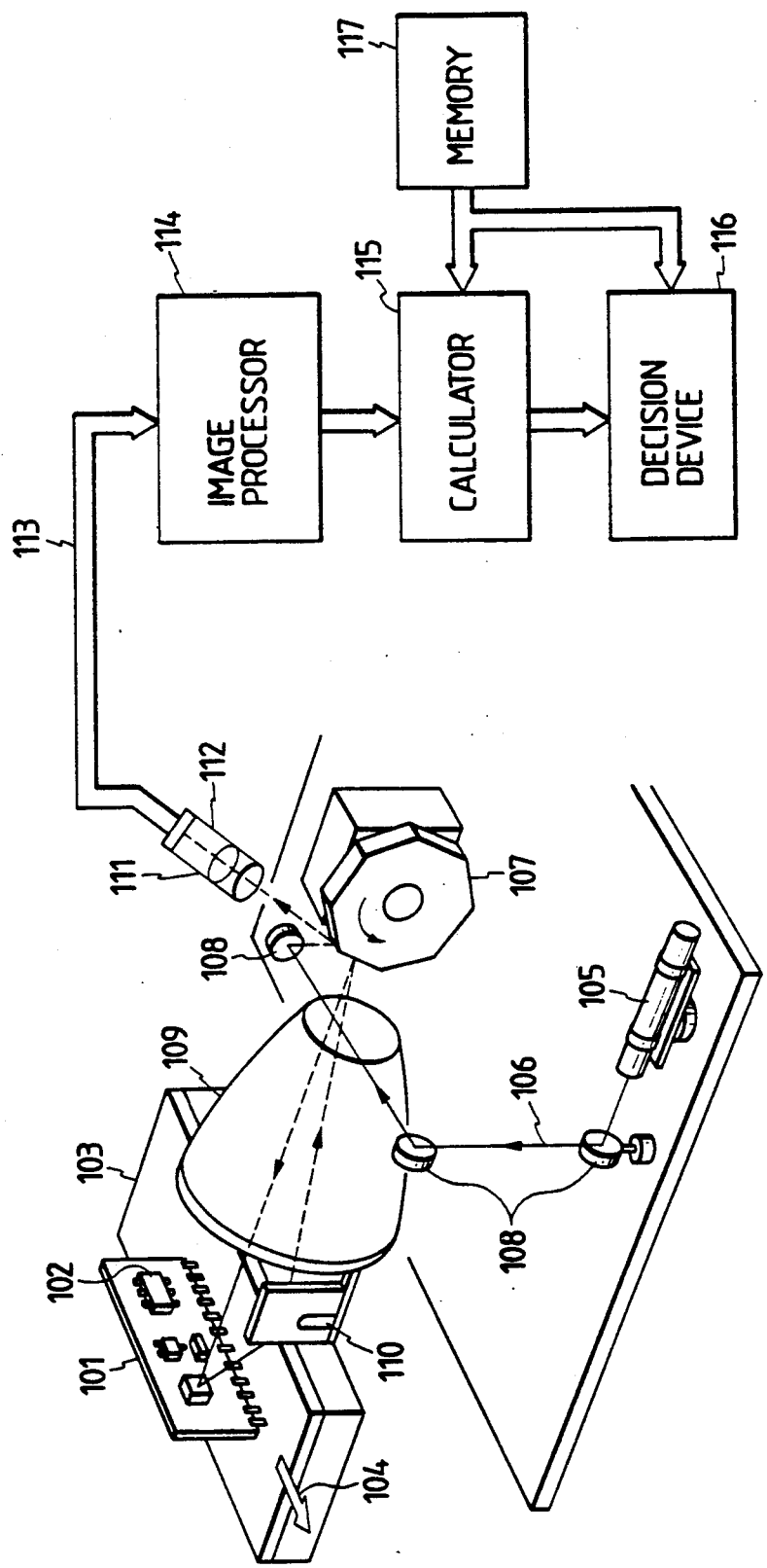
FIG. 1 is a diagram of a circuit board inspecting apparatus according to a first embodiment of this invention.

With reference to FIG. 1, a printed circuit board 101 is placed on a carrier 103 driven by a suitable device (not shown). The printed circuit board 101 is provided with circuit parts 102 and related solder portions (not shown in FIG. 1). The printed circuit board 101 can be moved together with the carrier 103 in a predetermined direction 104 which extends along a plane of the printed circuit board 101.

A laser 105 emits a beam of light, which is guided to a polygon mirror 107 via mirrors 108. The laser light beam is reflected by the polygon mirror 107 toward a spatial lens 109. After the laser light beam passes through the spatial lens 109, the laser light beam is applied to the printed circuit board 101 at essentially a right angle with respect to the plane of the printed circuit board 101. The polygon mirror 107 is rotated by a suitable device (no reference character). As the polygon mirror 107 rotates, a spot of the laser light beam on the printed circuit board 101 moves across the printed circuit board 101 in a direction perpendicular to the direction 104.

During a scanning process, the printed circuit board 101 is moved in the direction 104 and simultaneously the polygon mirror 107 is rotated so that the whole area of the printed circuit board 101 is two-dimensionally scanned by the laser light beam in a line-by-line scanning manner. During the scanning process, the laser light beam is reflected at or scattered by the surfaces of the printed circuit board 101, and a portion of the scatter light is returned to the polygon mirror 107 via a mirror 110 and the spatial lens 109. The returned light is reflected at the polygon mirror 107, and is then focused on an optical position sensor 112 via a condenser lens 111.

The position of a spot of the returned light on the optical position sensor 112 depends on the height of the point of the surface of the printed circuit board 101 at which the related laser light beam is scattered. This height is measured from the basic flat plane (the bottom plane) of the printed circuit board 101. The optical position sensor 112 detects the position of the spot of the returned light and outputs an electric position signal 113 representative of the position of the spot of the returned light, that is, the height of the point of the surface of the printed circuit board 101 at which the related laser light beam is scattered. During a scanning process, the whole area of the printed circuit board 101 is scanned by the laser light beam so that the output position signal 113 from the optical position sensor 112 sequentially represents the heights of the whole area of the printed circuit board 101.

The optical position sensor 112 is preferably composed of a semiconductor-type position-sensitive detector which has a pair of end electrodes. In this position-sensitive detector, currents I1 and I2 flowing through the end electrodes are inversely proportional to the distances between the position of a spot of incident light and the end electrodes respectively.

For a good scanning process, the movement of the printed circuit board 101 and the rotation of the polygon mirror 107 are maintained in a predetermined timing relation. Specifically, a sync signal containing a line sync component and a frame sync component is generated in response to the rotation of the polygon mirror 107 by a suitable device (not shown), and the sync signal is used in maintaining the predetermined timing relation between the movement of the printed circuit board 101 and the rotation of the polygon mirror 107. The sync signal is also used in determining a timing of the inputting of the position signal 113 into a later stage.

The position signal 113 is inputted into an image processor 114 at a timing determined by the sync signal. The image processor 114 converts the position signal 113 into data representing the heights of the exposed area of the printed circuit board 101, the circuit parts 102 on the printed circuit board 101, and the solder portions related to the circuit parts 102. The height data are outputted from the image processor 114 to a calculator 115.

The calculator 115 receives predetermined mask data from a memory 117. The mask data represent the positions of the solder portions with respect to the printed circuit board 101. The calculator 115 accepts the height data of the solder portions and rejects the height data of the other portions by referring to the mask data. The calculator 115 accumulatively adds the height data of each of the solder portions. The calculator 115 outputs data representative of the results of the accumulative additions to a decision device 116. Since the integral or the addition of the heights of a solder portion depends on the volume or amount of solder of this portion, the result of the accumulative addition represents the amount of solder of the portion.

For each of the solder portions, the decision device 116 compares the result of the accumulative addition of the height data with predetermined reference data representative of a desired amount of solder. The decision device 116 decides whether conditions of the solder portion are acceptable or unacceptable on the basis of the result of the previously-mentioned comparison. The decision device 116 receives the mask data from the memory 117. The decision device 116 uses the mask data in executing the comparing process for each of the solder portions and suspending the comparing process for the other portions.

The devices 114–117 can be a microcomputer system which operates in accordance with a program stored in its internal ROM. The devices 114–117 will now be further described.

Figure 2:
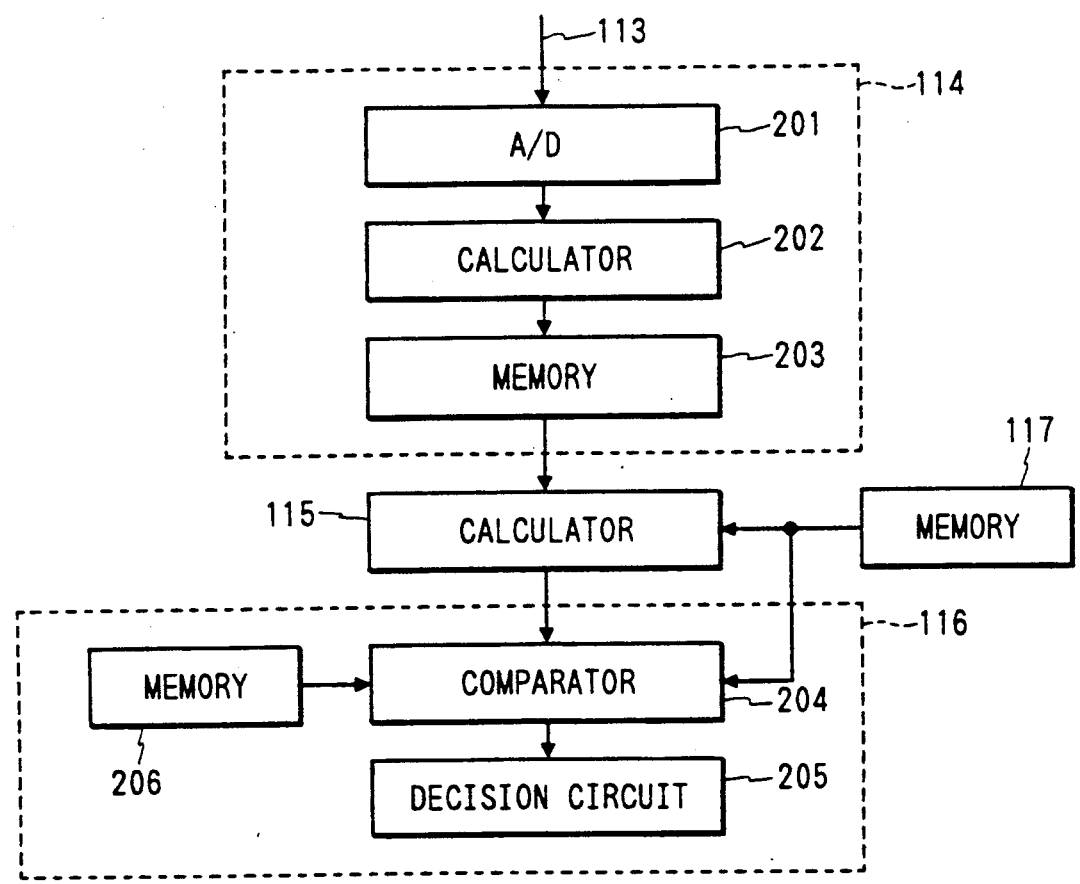
FIG. 2 is a block diagram of an electric signal processing part of the apparatus of FIG. 1.

As shown in FIG. 2, the image processor 114 includes an A/D converter 201, a calculator 202, and a memory 203. The A/D converter 201 converts the position signal 113 into a corresponding digital position signal fed to the calculator 202. In the case where the optical position sensor 112 is composed of the previously-mentioned position-sensitive detector, the digital position signal represents the currents I1 and I2. In this case, the calculator 202 calculates height data by referring to the following equation.

$$\text{Height Data} = K \cdot (I1 - I2)/(I1 + I2) \quad (1)$$

where K denotes a predetermined coefficient for normalization. The calculator 202 stores the height data into the memory 203. Then, the height data are outputted from the memory 203 to the calculator 115.

As described previously, the calculator 115 accepts the height data of the solder portions and rejects the height data of the other portions by referring to the mask data from the memory 117. The calculator 115 accumulatively adds the height data of each of the solder portions. The calculator 115 outputs data representative of the results of the accumulative additions to the decision device 116.

The decision device 116 includes a comparator 204, a decision circuit 205, and a memory 206. The comparator 204 receives the output data from the calculator 115 which represent the results of the accumulative additions. The comparator 204 receives the predetermined reference data from the memory 206 which represent desired amounts of solder in the respective solder portions. For each of the solder portions, the comparator 204 compares the result of the accumulative addition of the height data with the predetermined reference data, and generates comparison data representing the difference between the result of the accumulative addition and the predetermined reference data. The comparator 204 receives the mask data from the memory 117. The comparator 204 uses the mask data in executing the comparing process for each of the solder portions and suspending the comparing process for other other portions. The decision circuit 205 receives the comparison data from the comparator 204. For each of the solder portions, the decision circuit 205 decides whether conditions of the solder portion are acceptable or unacceptable on the basis of the difference between the result of the accumulative addition and the predetermined reference data which is represented by the comparison data. The result of the decision by the decision circuit 205 is indicated by a suitable device (not shown).

Figure 3:
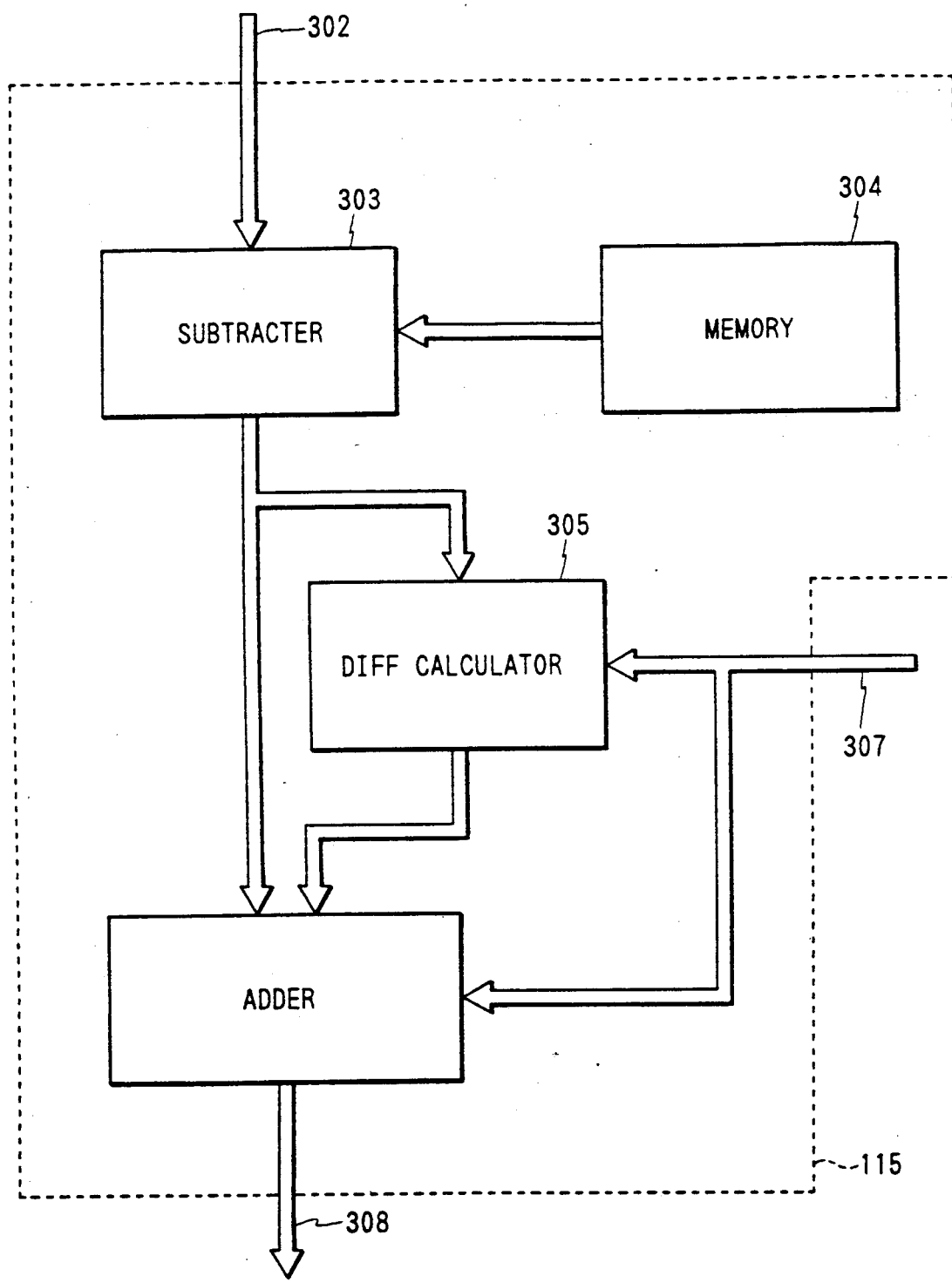
FIG. 3 is a block diagram of the calculator of FIGS. 1 and 2.

As shown in FIG. 3, the calculator 115 includes a subtracter 303, a memory 304, a differential calculator 305, and an accumulative adder 306. The subtracter 303 receives the height data 302 from the image processor 114. The subtracter 303 also receives data from the memory 304 which represent a predetermined average height of the surfaces of the printed circuit board 101. The subtracter 303 subtracts the average height data from the measured height data 302, converting the measured height data 302 into new height data representing the heights relative to the average height. The new height data are fed from the subtracter 303 to the differential calculator 305 and the accumulative adder 306.

The differential calculator 305 calculates a time-dependent variation or a differential of the received height data, and generates data representing the calculated differential. It is preferable that the calculated differential is defined in a direction from a solder portion toward related circuit parts. The differential data are fed to the accumulative adder 306. The accumulative adder 306 accumulatively adds the height data from the subtracter 303 in response to the differential data from the differential calculator 305. Thus, the accumulative addition of the height data is controlled in response to the differential data. Specifically, the accumulative adder 306 executes the accumulative addition of the height data from the subtracter 303 in the case where the value represented by the differential data is positive and is smaller than a predetermined threshold value A. The accumulative adder 306 suspends the accumulative addition in the case where the value represented by the differential data is equal to or greater than the threshold value A or in the case where the value represented by the differential data is negative. The threshold value A is preferable equal to a value corresponding to one third of the height of the related circuit parts 102.

The differential calculator 305 and the accumulative adder 306 receive the mask data 307 from the memory 117. The differential calculator 305 and the accumulative adder 306 execute and suspend their calculating processes in response to the mask data 307. Specifically, in the case where the devices 305 and 306 are informed by the mask data 307 that the currently processed signals correspond to the solder portions, the devices 305 and 306 execute their calculating processes. In the case where the currently processed signals correspond to the other portions, the devices 305 and 306 suspend their calculating processes.

The accumulative addition result 308 outputted from the accumulative adder 306 sequentially represents measured amounts of solder in the respective solder portions. The decision device 116 evaluates the accumulative addition result 308, and realizes the decision as to whether conditions of the solder portions are acceptable or unacceptable by referring to the result of the evaluation.

It is now assumed that, a solder portion 402 related to circuit parts 403 on a printed circuit board 401 has profiles as shown in the parts (a) and (b) of FIG. 4. In this case, height data are accumulatively added in a range 405 where the x-direction differential profile 404 of the height data are positive and are smaller than the threshold value A as shown in the part (c) of FIG. 4, and thereby the volume of the solder portion 402 is calculated. In the part (c) of FIG. 4, the differential of the height data is represented by the character ΔZ. A predetermined solder portion represented by the mask data is shown as a hatched region 407 corresponding to a range 406 and extending in the printed circuit board 401, the actual solder portion 402, and the circuit parts 403. The height data in this solder region 407 are used in the calculation executed by the calculator 115.

DESCRIPTION OF THE SECOND PREFERRED EMBODIMENT

Figure 5:
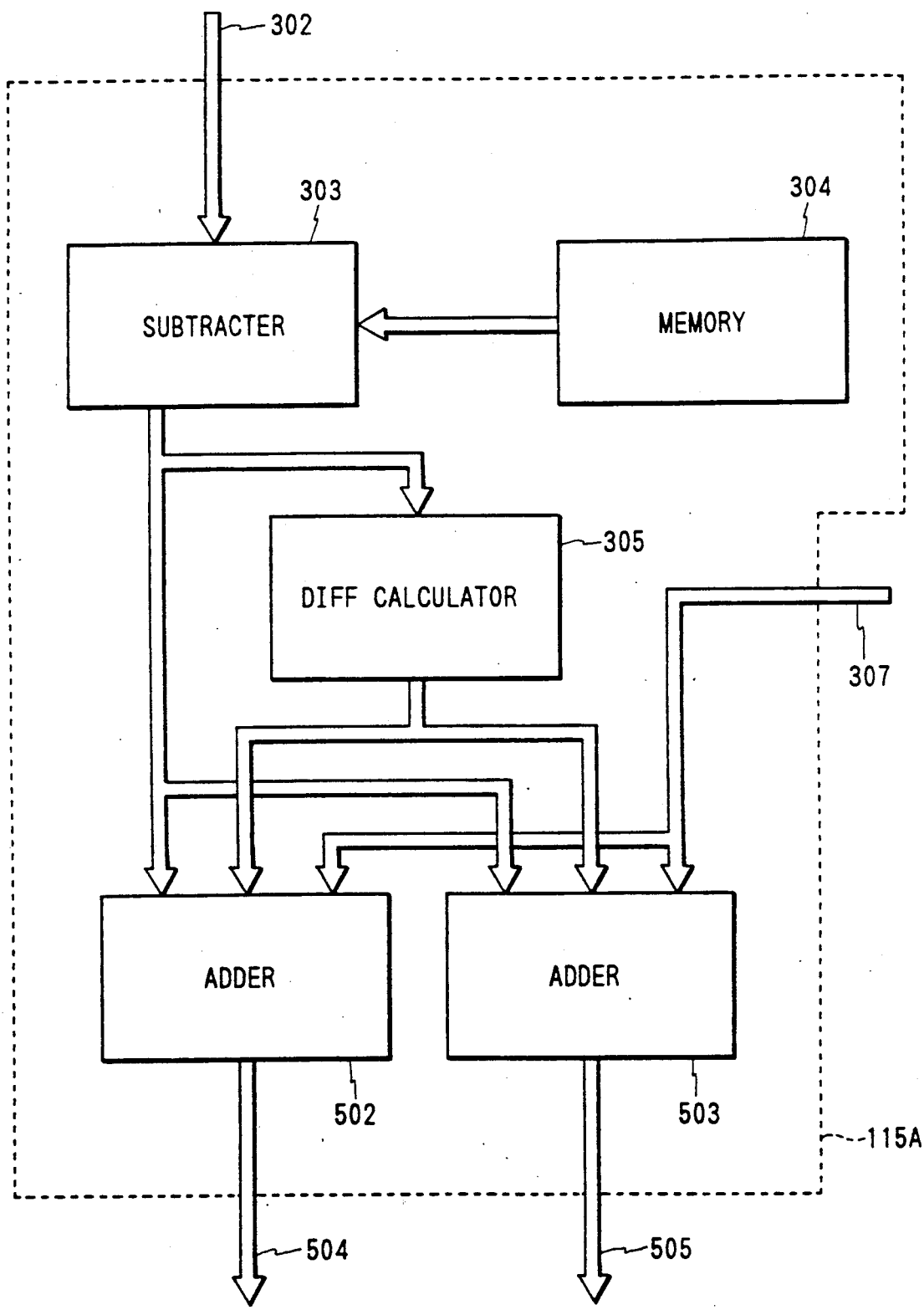
FIG. 5 is a block diagram of a calculator in an apparatus of a second embodiment of this invention.

FIG. 5 shows a second embodiment of this invention which is similar to the embodiment of FIGS. 1–4 except for the following design changes. In the embodiment of FIG. 5, a calculator 115A following an image processor 114 (see FIG. 1) includes accumulative adders 502 and 503. The accumulative adder 502 corresponds to the accumulative adder 306 of FIG. 3. The accumulative adder 503 serves to accumulatively add output height data from a subtracter 303 in the case where the value represented by output differential data from a differential calculator 305 is negative. A decision device 116 (see FIG. 1) following the calculator 115A is modified to evaluate both the accumulative addition results 504 and 505 obtained by the accumulative adders 502 and 503. The evaluation includes comparison between the accumulative addition results 504 and 505 and predetermined reference data. By referring to the result of this comparison, the decision device 116 executes a decision whether solder portions are acceptable or unacceptable.

Figure 6A:
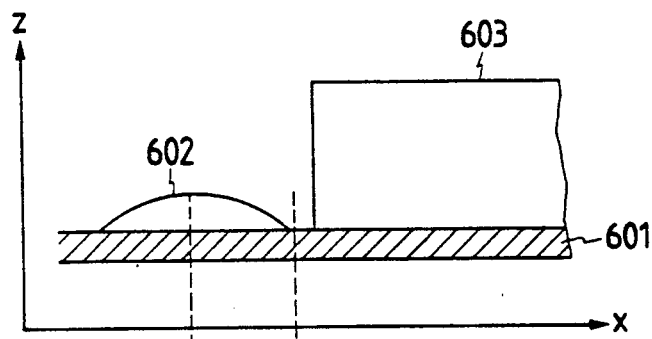
FIGS. 6a and 6b are diagrams including a sectional view of a printed circuit board and an illustration of a profile of the differential of height data in the apparatus of the second embodiment of this invention.
Figure 6B:
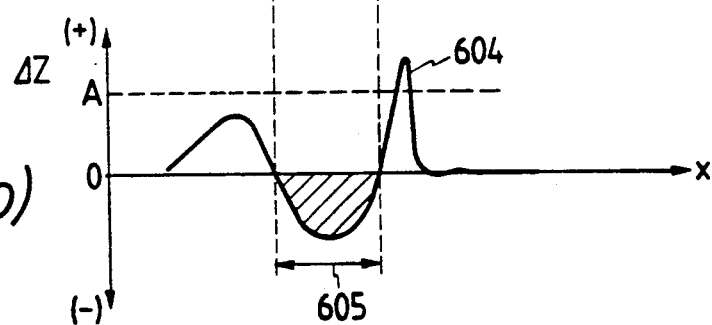

It is now assumed that, as shown in the part (a) of FIG. 6, a solder portion 602 related to circuit parts 603 on a printed circuit board 601 is separate from the circuit parts 603 and is unacceptable. In this case, height data are accumulatively added by the accumulative adder 503 in a range 605 where the x-direction differential profile 604 of the height data is negative as shown in the part (b) of FIG. 6. By evaluating both the accumulative addition results 504 and 505, it is possible to more accurately detect conditions of the solder portion 602.

DESCRIPTION OF THE THIRD PREFERRED EMBODIMENT

Figure 7:
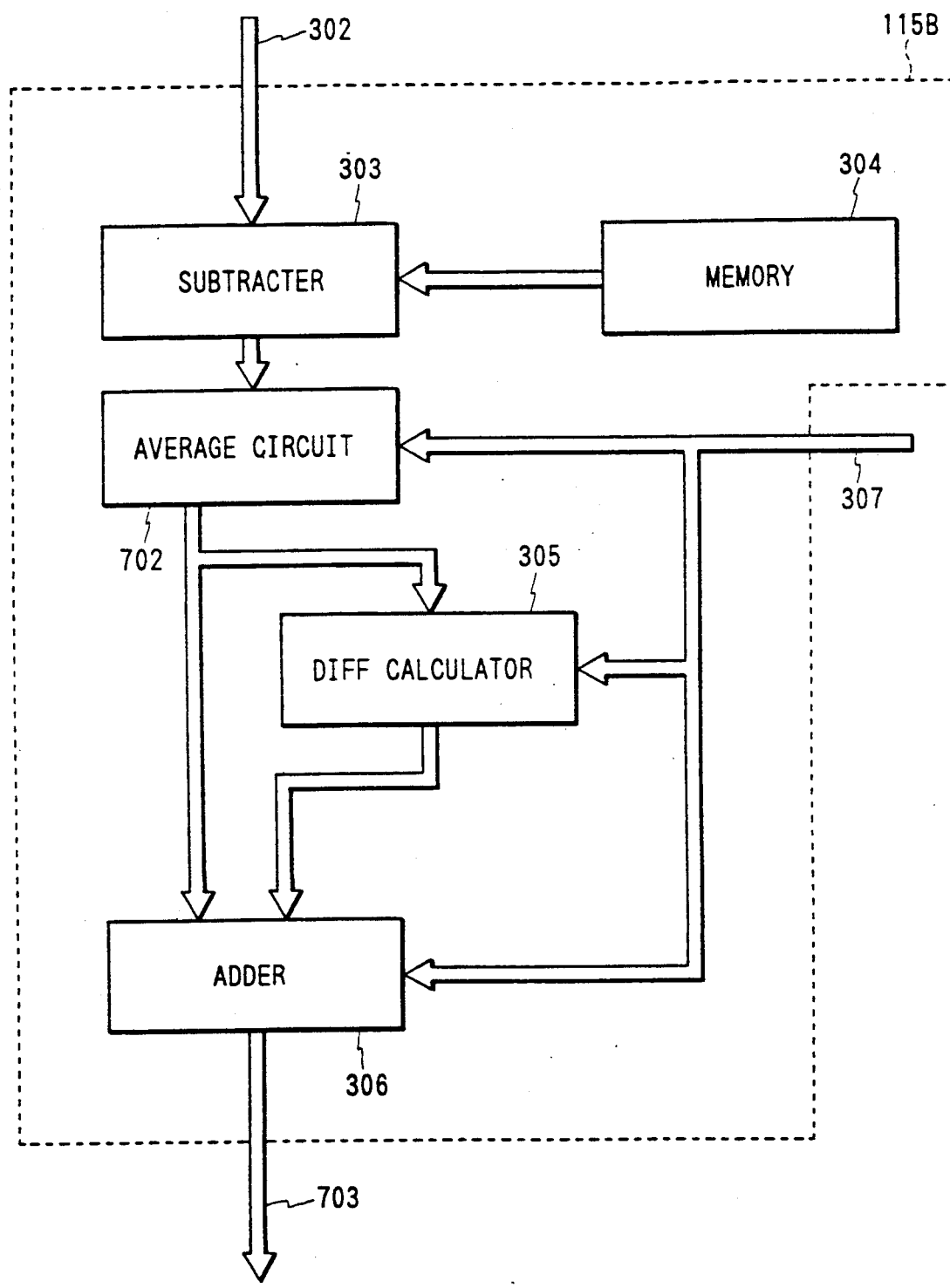
FIG. 7 is a block diagram of a calculator in an apparatus of a third embodiment of this invention.

FIG. 7 shows a third embodiment of this invention which is similar to the embodiment of FIGS. 1–4 except for the following design change. In the embodiment of FIG. 5, a calculator 115B following an image processor (see FIG. 1) additionally includes an averaging circuit 702 receiving height data from a subtracter 303. The averaging circuit 702 averages a predetermined number of the height data, for example, two height data in a direction of the differential calculation and five height data in a direction perpendicular to the former direction. In other words, the averaging circuit 702 averages the height data which corresponds to a two-dimensional region of a predetermined size. The averaging circuit 702 functions to remove noise components from the height data. The output data from the averaging circuit 702 are fed to a differential calculator 305 and an accumulative adder 306.

DESCRIPTION OF THE FOURTH PREFERRED EMBODIMENT

FIG. 8 shows a fourth embodiment of this invention which is similar to the embodiment of FIGS. 1–4 except for the following design changes. In the embodiment of FIG. 8, a calculator 115C following an image processor 114 (see FIG. 1) includes an averaging circuit 1302, a differential calculator 1303, a comparator 1304, a memory 1305, an accumulative adder 1306, and an accumulative adder 1307.

The averaging circuit 1302 receives height data 1301 from the image processor 114 (see FIGS. 1 and 2). The averaging circuit 1302 averages a predetermined number of the height data 1301, for example, two height data in a direction of later differential calculation and five height data in a direction perpendicular to the former direction. In other words, the averaging circuit 1302 averages the height data 1301 which corresponds to a two-dimensional region of a predetermined size. The averaging circuit 1302 functions to remove noise components from the height data 1301. The average height data outputted from the averaging circuit 1302 are fed to the differential calculator 1303.

The differential calculator 1303 calculates a time-dependent variation or a differential of the received average height data, and generates data representing the calculated differential. It is preferable that the calculated differential is defined in a direction from a solder portion toward related circuit parts. The differential data are fed to the comparator 1304 and the accumulative adders 1306 and 1307.

The accumulative adders 1306 and 1307 accumulatively add the differential data, and generate data 1309 and 1310 representing the results of the accumulative additions respectively. The accumulative adders 1306 and 1307 execute and suspend their adding processes in response to control signals fed from the comparator 1304.

The comparator 1304 receives the differential data from the differential calculator 1303. The comparator 1304 also receives data from the memory 1305 which represent a predetermined positive threshold value A1 and a predetermined negative threshold value A2. The comparator 1304 compares the value, represented by the differential data, with the threshold values A1 and A2, and generates the control signals in response to the result of the comparison. The control signals are fed to the accumulative adders 1306 and 1307 respectively. Specifically, in the case where the differential value is greater than 0 but smaller than the threshold value A1, the control signal to the accumulative adder 1306 enables the accumulative adder 1306 to execute its adding process. In the other cases, the control signal to the accumulative adder 1306 forces the accumulative adder 1306 to suspend its adding process. In the case where the differential value is negative and its absolute value is smaller than the absolute value of the threshold value A2, the control signal to the accumulative adder 1307 enables the accumulative adder 1307 to execute its adding process. In the other cases, the control signal to the accumulative adder 1307 forces the accumulative adder 1307 to suspend its adding process. The threshold values A1 and A2 are preferably equal to positive and negative values whose absolute values correspond to one third of the height of the related circuit parts.

The devices 1302, 1303, 1304, 1306, and 1307 receive mask data 1308 from a memory 117 (see FIG. 1). The devices 1302, 1303, 1304, 1306, and 1307 execute and suspend their calculating processes in response to the mask data 1308. Specifically, in the case where the devices 1302, 1303, 1304, 1306, and 1307 are informed by the mask data 1308 that the currently processed signals correspond to solder portions, these devices execute their calculating processes. In the case where the currently processed signals correspond to the other portions, these devices suspend their calculating processes.

The accumulative addition results 1309 and 1310 outputted from the accumulative adders 1306 and 1307 represent detected profiles or shapes of the solder portions. A decision device 116 (see FIG. 1) following the calculator 115C evaluates both the accumulative addition results 1309 and 1310. This evaluation includes comparison between the accumulative addition results 1309 and 1310 and predetermined reference values. By referring to the result of this comparison, the decision device 116 realizes a decision as to whether or the solder portions are acceptable or unacceptable.

Figure 9A:
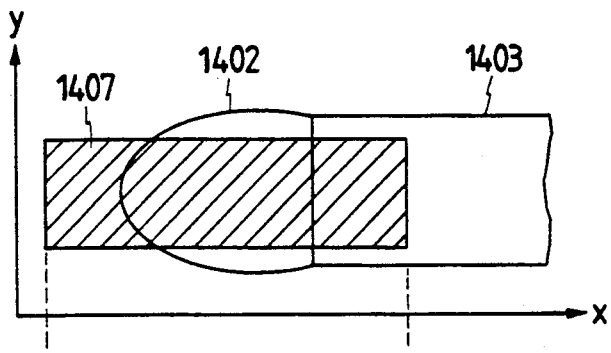
FIGS. 9a, 9b, and 9c are diagrams including a plan view and a sectional view of a printed circuit board, and an illustration of a profile of the differential of height data in the apparatus of the fourth embodiment of this invention.
Figure 9B:
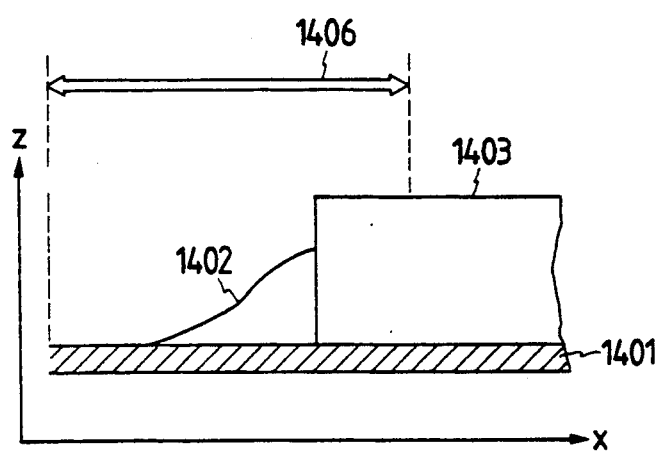
Figure 9C:
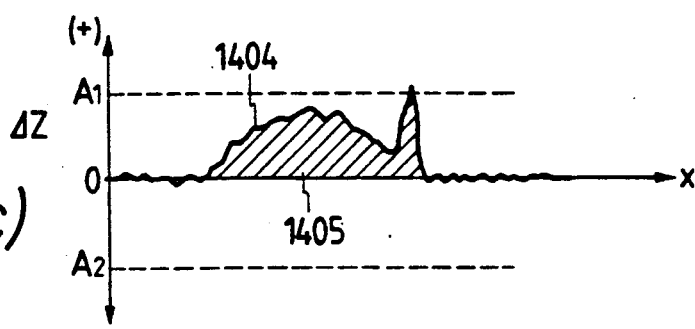

It is now assumed that, as shown in the parts (a) and (b) of FIG. 9, a solder portion 1402 related to circuit parts 1403 on a printed circuit board 1401 is good and thus has a monotonically increasing profile. In this case, the accumulative addition result 1309 outputted from the accumulative adder 1306 is significantly greater than 0 while the accumulative addition result 1310 outputted from the accumulative adder 1307 is close to 0. Specifically, differential data are accumulatively added by the accumulative adder 1306 in a range 1405 where the x-direction differential profile 1404 of the height data is greater than 0 but smaller than the threshold value A1 as shown in the part (c) of FIG. 9, and thereby the shape of the solder portion 1402 is calculated. In the part (c) of FIG. 9, the differential is represented by the character $\Delta Z$. A predetermined solder portion represented by the mask data is shown as a hatched region 1407 corresponding to a range 1406 and extending in the printed circuit board 1401, the actual solder portion 1402, and the circuit parts 1403. The height data in this solder region 1407 are used in the calculation executed by the calculator 115C.

Figure 10A:
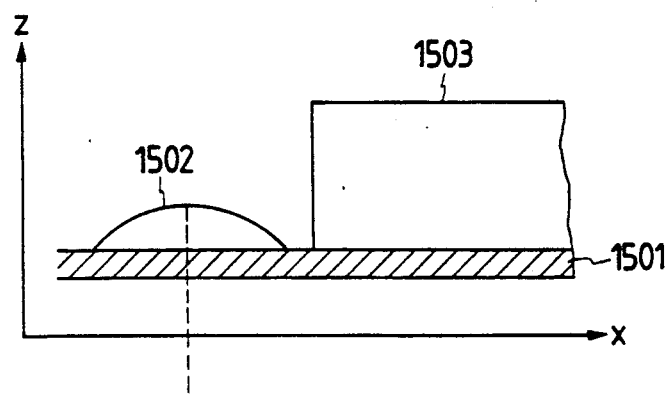
FIGS. 10a and 10b are diagrams including a sectional view of a printed circuit board and an illustration of a profile of the differential of height data in the apparatus of the fourth embodiment of this invention.
Figure 10B:
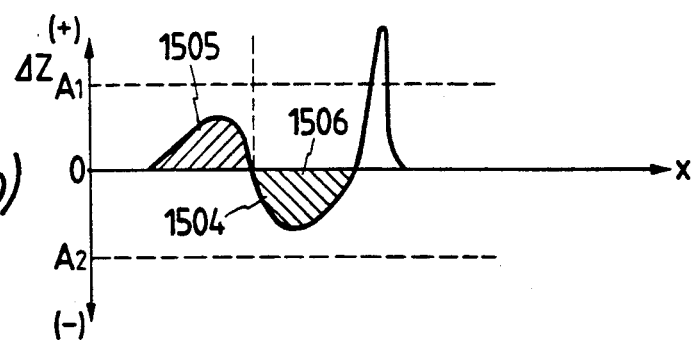

It is now assumed that, as shown in the part (a) of FIG. 10, a solder portion 1502 related to circuit parts 1503 on a printed circuit board 1501 is separated from the circuit parts 1503 and is unacceptable. In this case, both the accumulative addition results 1309 and 1310 outputted from the accumulative adders 1306 and 1307 are significantly greater than 0. Specifically, differential data are accumulatively added by the accumulative adder 1306 in a range 1505 where the x-direction differential profile 1504 of the height data is positive but smaller than the threshold value A1, while differential data are accumulatively added by the accumulative adder 1307 in a range 1506 where the x-direction differential profile 1504 of the height data is negative and is greater than the threshold value A2 in abosolute value as shown in the part (b) of FIG. 10.

The relation between the conditions of a solder portion and the accumulative addition results 1309 and 1310 is used by the decision device in deciding whether the solder portion is acceptable or unacceptable.

DESCRIPTION OF THE FIFTH PREFERRED EMBODIMENT

Figure 11:
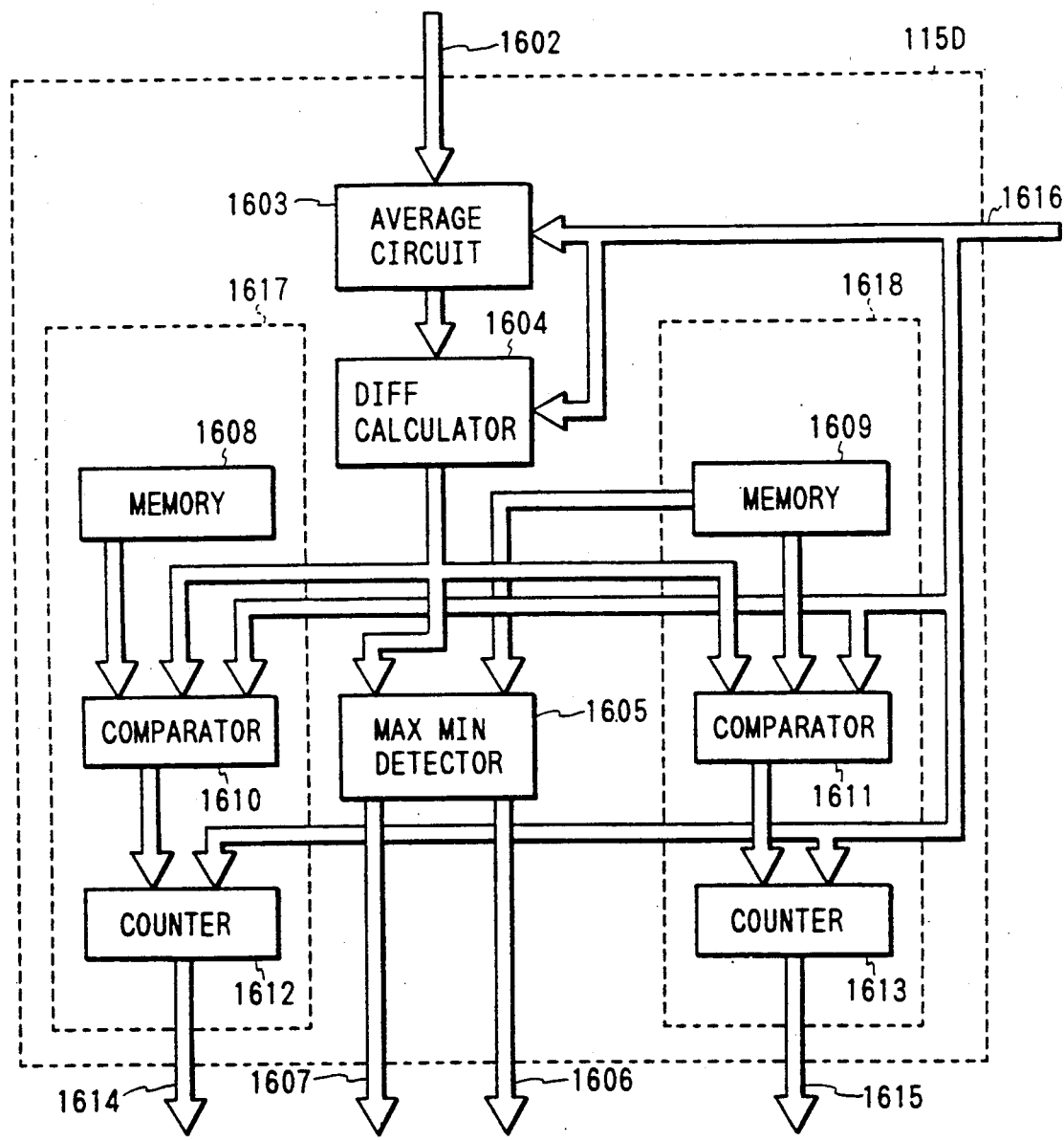
FIG. 11 is a block diagram of a calculator in an apparatus of a fifth embodiment of this invention.

FIG. 11 shows a fifth embodiment of this invention which is similar to the embodiment of FIGS. 1-4 except for the following design changes. In the embodiment of FIG. 11, a calculator 115D following an image processor 114 (see FIG. 1) includes an averaging circuit 1603, a differential calculator 1604, a maximum and minimum detector 1605, and comparison count circuits 1617 and 1618. The comparison count circuit 1617 includes a memory 1608, a comparator 1610, and a counter 1612. The comparison count circuit 1618 includes a memory 1609, a comparator 1611, and a counter 1613.

The averaging circuit 1603 receives height data 1602 from the image processor 114 (see FIGS. 1 and 2). The averaging circuit 1603 averages a predetermined number of the height data 1602. The function of the averaging circuit 1603 is similar to the function of the averaging circuit 1302 of FIG. 8. The average height data outputted from the averaging circuit 1603 are fed to the differential calculator 1604. The differential calculator 1604 calculates a time-dependent variation or a differential of the received average height data, and generates data representing the calculated differential. The function of the differential calculator 1604 is similar to the function of the differential calculator 1303 of FIG. 8. The differential data outputted from the differential calculator 1604 are fed to the maximum and minimum detector 1605, and the comparators 1610 and 1611.

The maximum and minimum detector 1605 detects the maximum value 1606 and the minimum value 1607 of the differential data outputted from the differential calculator 1604.

The comparator 1610 receives data from the memory 1608 which represent predetermined threshold values A1 and A3. The comparator 1610 also receives the differential data from the differential calculator 1604 which represents the differential value. The comparator 1610 compares the differential value with the threshold values A1 and A3, and generates a control signal on the basis of the result of the comparison. The control signal is fed from the comparator 1610 to the counter 1612. The counter 1612 is controlled in response to the control signal. Specifically, in the case where the differential value is greater than the threshold value A3 but smaller than the threshold value A1, the counter 1612 counts up in response to the control signal. In the other cases, the counter 1612 suspends the counting up in response to the control signal. The counter 1612 outputs a signal 1614 of the count number which represents the total number of times of the detection that the differential value lies in the positive range between the threshold values A1 and A3.

The comparator 1611 receives data from the memory 1609 which represent predetermined threshold values A2 and A4. The comparator 1611 also receives the differential data from the differential calculator 1604 which represents the differential value. The comparator 1611 compares the differential value with the threshold values A2 and A4, and generates a control signal on the basis of the result of the comparison. The control signal is fed from the comparator 1611 to the counter 1613. The counter 1613 is controlled in response to the control signal. Specifically, in the case where the differential value is greater than the threshold value A2 but smaller than the threshold value A4, the counter 1613 counts up in response to the control signal. In the other cases, the counter 1613 suspends the counting up in response to the control signal. The counter 1613 ouputs a signal 1615 of the count number which represents the total number of times of the detection that the differential value lies in the negative range between the threshold values A2 and A4.

The threshold values A1 and A2 are preferably equal to positive and negative values whose absolute values correspond to one third of the height of the related circuit parts. The threshold values A3 and A4 are preferably equal to positive and negative values whose absolute values correspond to one tenth of the height of the related circuit parts.

The maximum value 1606 and the minimum value 1607 detected by the maximum and minimum detector 1605 may be limited by the threshold values A1 and A2. In this case, the maximum value is selected from a range smaller than the threshold value A1. The minimum value 1607 is selected from a range of negative differential values whose absolute values are smaller than the absolute value of the threshold value A2.

The devices 1603, 1604, 1610, 1611, 1612, and 1613 receive mask data 1616 from a memory 117 (see FIG. 1). The devices 1603, 1604, 1610, 1611, 1612, and 1613 execute and suspend their operations in response to the mask data 1616. Specifically, in the case where the devices 1603, 1604, 1610, 1611, 1612, and 1613 are informed by the mask data 1616 that the currently processed signals correspond to solder portions, these devices execute their operations. In the case where the currently processed signals correspond to the other portions, these devices suspend their operations.

The maximum value 1606, the minimum value 1607, and the count numbers 1614 and 1615 outputted from the calculator 115D represent the distribution shape of the differential values of the height data 1602. A decision device 116 (see FIG. 1) following the calculator 115D evaluates these values 1606, 1607, 1614, and 1615. This evaluation includes comparison between the values 1606, 1607, 1614, and 1615, and predetermined reference values. By referring to the result of this comparison, the decision device 116 realizes a decision as to whether the solder portions are acceptable or unacceptable.

Figure 12:
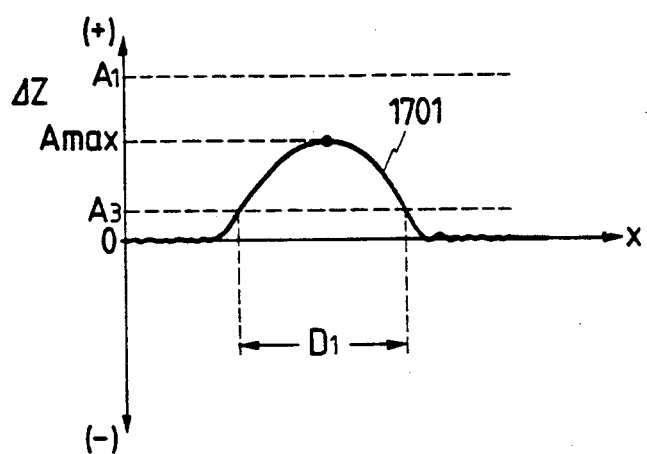
FIG. 12 is a diagram showing a profile of the differential of height data which is obtained for a good solder portion in the apparatus of the fifth embodiment of this invention.

In the case of a good solder portion, the corresponding height data has an x-direction differential profile 1701 such as shown in FIG. 12. In this case, the maximum value detected by the maximum and minimum detector 1605 is equal to a value Amax while the minimum value detected by the maximum and minimum detector 1605 is close to 0. The count number outputted from the counter 1612 corresponds to a length D1 in a sectional viewpoint.

Figure 13:
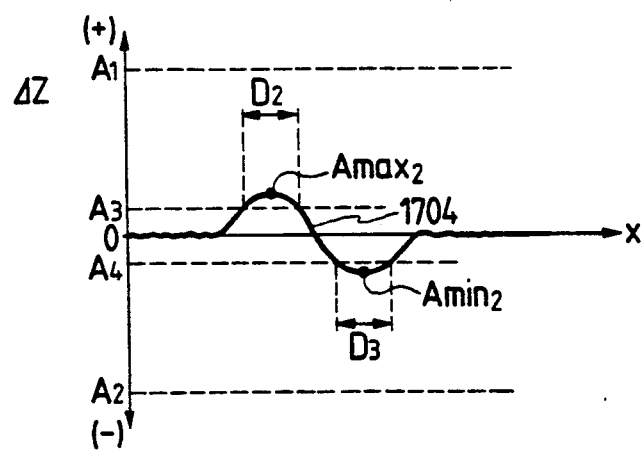
FIG. 13 is a diagram showing a profile of the differential of height data which is obtained for a poor solder portion in the apparatus of the fifth embodiment of this invention.

In the case of a poor solder portion which separates from the related circuit parts, the corresponding height data has an x-direction differential profile 1704 such as shown in FIG. 13. In this case, the maximum value and the minimum value detected by the maximum and minimum detector 1605 are equal to a value Amax2 and a value Amin2 respectively. The count number outputted from the counter 1612 corresponds to a length D2 in a sectional viewpoint. The count number outputted from the counter 1613 corresponds to a length D3 in a sectional view point.

Since a solder portion has a two-dimensional surface, the count numbers outputted from the counters 1612 and 1613 represent a surface area of the solder portion. As understood from the previous description, in the case of a good solder portion, the maximum value outputted from the maximum and minimum detector 1605 is great while the minimum value outputted therefrom is close to 0. In addition, the count number outputted from the counter 1612 is great while the count number outputted from the counter 1613 is close to 0. On the other hand, in the case of a poor solder portion, the maximum value outputted from the maximum and minimum detector 1605 is small and also the count number outputted from the counter 1612 is small. Especially, in the case of a poor solder portion which separates from the related circuit parts, the count number outputted from the counter 1613 is significantly larger than 0 and the minimum value detected by the maximum and the minimum detector 1605 is significantly smaller than 0. The relation between the goodness and poorness of solder portions and the maximum value, the minimum value, and the count numbers are used by the decision device 116 in deciding whether the solder portions are acceptable or unacceptable.

DESCRIPTION OF THE SIXTH PREFERRED EMBODIMENT

Figure 14:
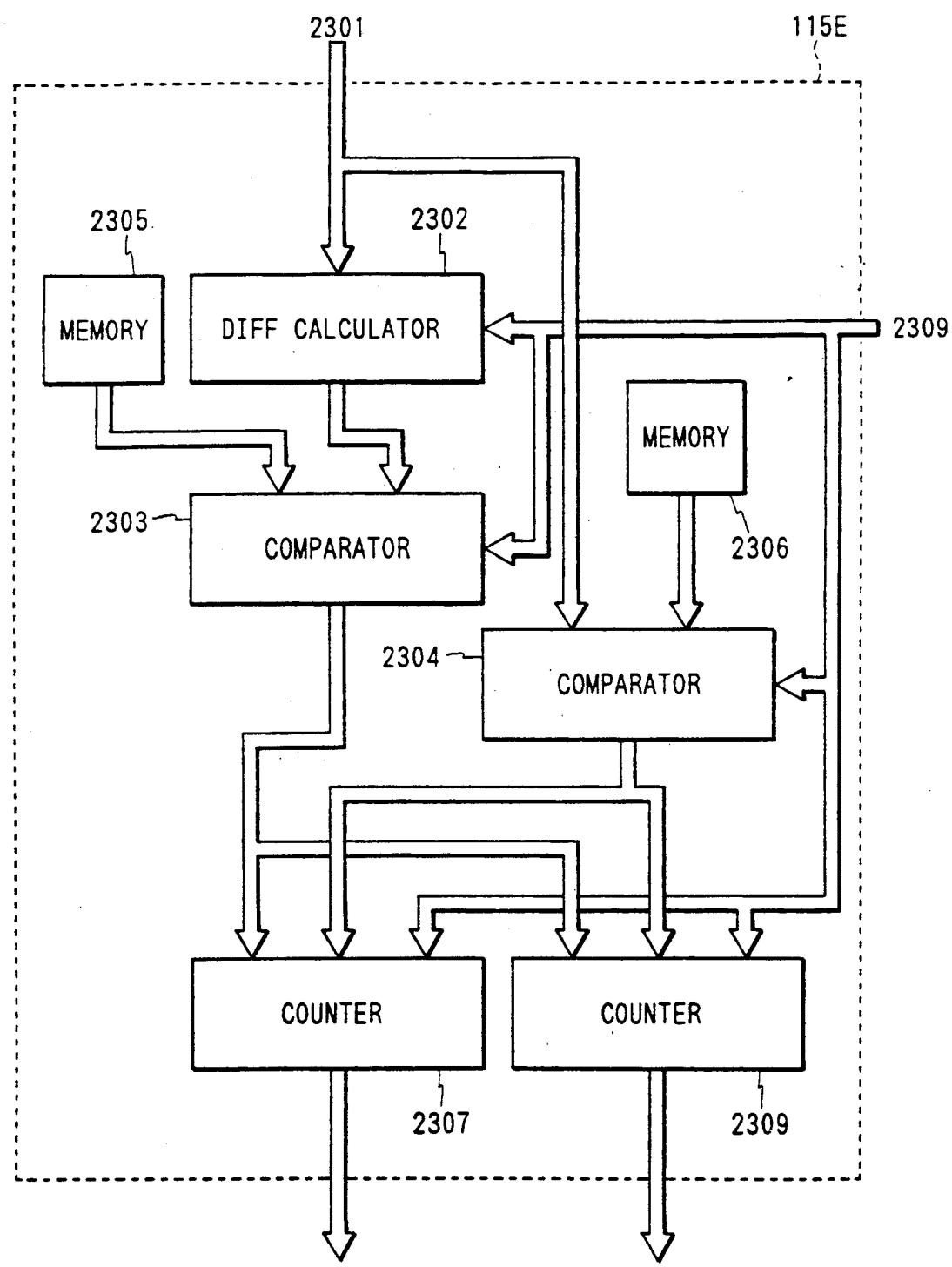
FIG. 14 is a block diagram of a calculator in an apparatus of a sixth embodiment of this invention.

FIG. 14 shows a sixth embodiment of this invention which is similar to the embodiment of FIGS. 1-4 except for the following design changes. In the embodiment of FIG. 14, a calculator 115E following an image processor 114 (see FIG. 1) includes a differential calculator 2302, comparators 2303 and 2304, memories 2305 and 2306, and counters 2307 and 2309.

The differential calculator 2302 receives height data 2301 from the image processor (see FIGS. 1 and 2). The differential calculator 2302 calculates a time-dependent variation or a differential of the received height data 2301, and generates data representing the calculated differential. The function of the differential calculator 2302 corresponds to the function of the differential calculator 1303 of FIG. 8. The differential data outputted from the differential calculator 2302 are fed to the comparator 2303.

The comparator 2303 receives data from the memory 2305 which represent a pair of predetermined threshold values defining a predetermined range. The comparator 2303 also receives the differential data from the differential calculator 2302 which represents the differential value. The comparator 2303 compares the differential value with the threshold values, and outputs a signal which depends on the result of the comparison. Specifically, when the differential value lies in the predetermined range defined by the threshold values, the comparator 2303 outputs a "1" signal. Otherwise, the comparator 2303 outputs a "0" signal. The output signal from the counter 2303 is fed to the counters 2307 and 2309.

The comparator 2304 receives the height data 2301. The comparator 2304 also receives data from the memory 2306 which represent a pair of predetermined threshold values defining a predetermined range. The comparator 2304 compares the height data with the threshold values, and outputs a signal which depends on the result of the comparison. Specifically, when the height data lie in the predetermined range defined by the threshold values, the comparator 2304 outputs a "1" signal. Otherwise, the comparator 2304 outputs a "0" signal. The output signal from the counter 2304 is fed to the counters 2307 and 2309.

The devices 2302, 2303, 2304, 2307, and 2309 receive mask data 2309 from a memory 117 (see FIGS. 1 and 2). The devices 2302, 2303, 2304, 2307, and 2309 execute and suspend their operations in response to the mask data 2309. Specifically, in the case where the devices 2302, 2303, 2304, 2307, and 2309 are informed by the mask data 2309 that the currently processed signals correspond to solder portions, these devices execute their operations. In the case where the currently processed signals correspond to the other portions, these devices suspend their operations.

The counter 2307 receives the output signals from the comparators 2303 and 2304. For each of solder portions, the counter 2307 counts up when both the output signals from the comparators 2303 and 2304 are "1", and the counter 2307 suspends the counting up otherwise. Accordingly, the count number outputted from the counter 2307 represents the correlation between the height data and the differential data.

The counter 2309 receives the output signals from the comparators 2303 and 2304. For each of solder portions, the counter 2309 counts up when the output signals from the comparators 2303 and 2304 are "0" and "1" respectively, and the counter 2309 suspends the counting up otherwise. Accordingly, the count number outputted from the counter 2309 represents the correlation between the height data and the differential data.

A decision device 116 (see FIG. 1) following the calculator 115E evaluates the count numbers outputted from the counters 2307 and 2309. This evaluation includes comparison between the count numbers and predetermined reference numbers. By referring to the result of this comparison, the decision device 116 realizes a decision as to whether the solder portions are acceptable or unacceptable.

Figure 15A:
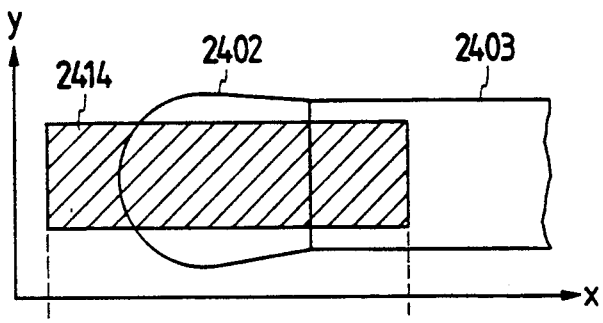
FIGS. 15a, 15b, and 15c are diagrams including a plan view and a sectional view of a printed circuit board, and an illustration of a distribution of data for a good solder portion in the apparatus of the sixth embodiment of this invention.
Figure 15B:
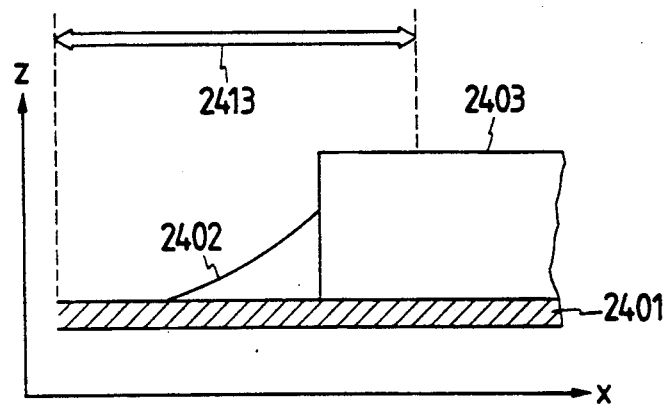
Figure 15C:
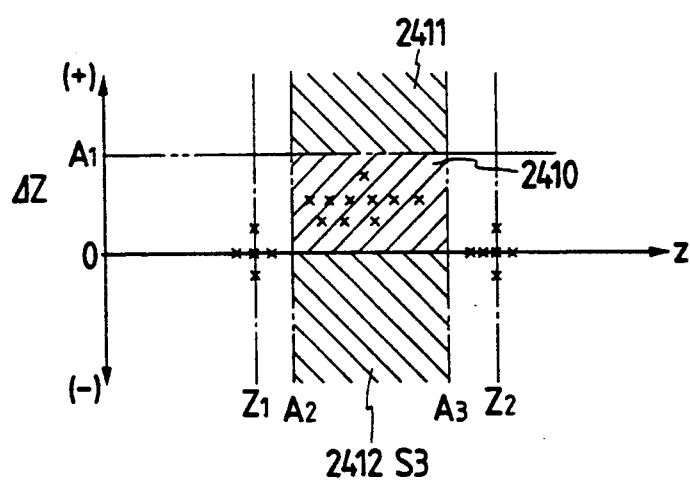

It is now assumed that, a solder portion 2402 related to circuit parts 2403 on a printed circuit board 2401 is good as shown in the parts (a) and (b) of FIG. 15. In this case, the detected correlation between height data Z and differential values $\Delta Z$ has a characteristic as shown in the part (c) of FIG. 15. In the part (c) of FIG. 15, Z1 and Z2 denote the average height of the printed circuit board 2401 and the average height of the circuit parts 2403 respectively, and the character "x" denotes general measured data given by corresponding height data and differential value data. A pair of corresponding measured differential value data and height data which compose general measured data is denoted by a single character "x". The threshold values for the differential values are set to 0 and a predetermined positive value A1. In addition, the threshold values for the height data are set to predetermined values A2 and A3 between the average heights Z1 and Z2. Specifically, the value A1 is equal to one third of the average height Z2 of the circuit parts 2403. The value A2 is greater than the average height Z1 of the printed circuit board 2401 by a value "$2 \times \sigma$", and the value A3 is smaller than the average height Z2 of the circuit parts 2403 by the value "$2 \times \sigma$" where "$\sigma$" denotes the standard deviation in the measurement of the heights of the printed circuit board 2401 and the circuit parts 2403.

In the part (c) of FIG. 15, since the solder portion 2402 is good, most of the measured data lie between the average heights Z1 and Z2 of the printed circuit board 2401 and the circuit parts 2403 and are generally in a positive region 2410 of differential values smaller than the threshold value A1. The positive region 2410 extends between the threshold values A2 and A3. For each of the differential values between 0 and the threshold value A1, the comparator 2303 outputs a "1" signal. For each of the height data between the threshold values A2 and A3, the comparator 2304 outputs a "1" signal. Thus, for each of the measured values extending in the region 2410, the counter 2307 counts up. Since many of the measured values are in the region 2410 as shown in the part (c) of FIG. 15, the count number outputted from the counter 2307 is high. On the other hand, for each of the differential values outside the range between 0 and the threshold value A1, the comparator 2303 outputs a "0" signal. Thus, for each of the measured values extending in hatched regions 2411 and 2412 above and below the region 2410, the counter 2309 counts up. Since none of the measured values is in the regions 2411 and 2412 as shown in the part (c) of FIG. 15, the count number outputted from the counter 2309 is 0 or low. The decision device 116 judges the solder portion 2402 to be good by the high count number and the low count number outputted from the counters 2307 and 2309 respectively. A predetermined solder portion represented by the mask data is shown as a hatched region 2414 corresponding to a range 2413 and extending in the printed circuit board 2401, the actual solder portion 2402, and the circuit parts 2403. The height data in this solder region 2414 are used in the calculation.

Figure 16A:
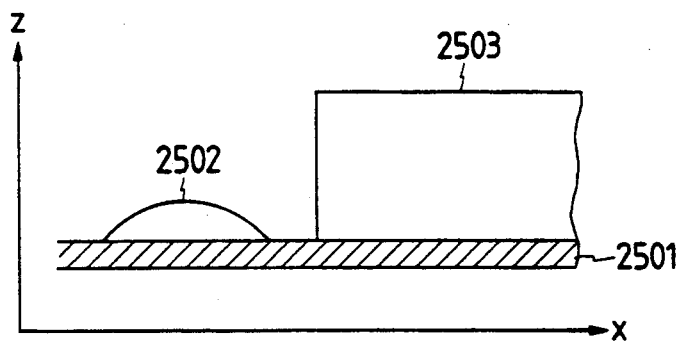
FIGS. 16a and 16b are diagrams including a sectional view of a printed circuit board and an illustration of a distribution of data for a poor solder portion in the apparatus of the sixth embodiment of this invention.
Figure 16B:
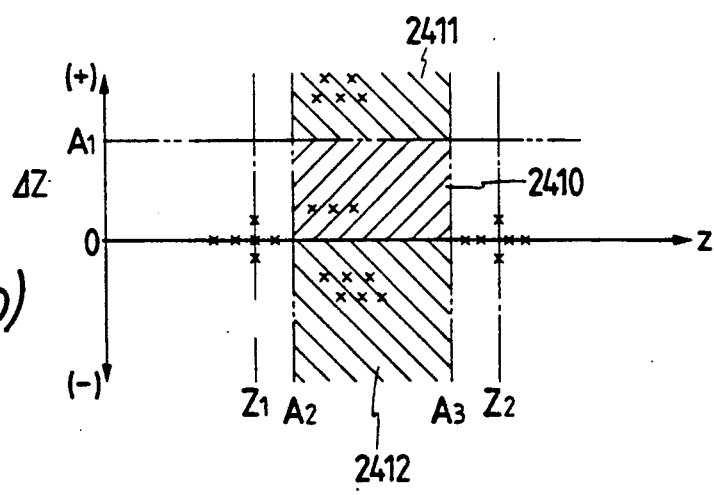

It is now assumed that, a solder portion 2502 is separate from a related circuit parts 2503 on a printed circuit board 2501 and is thus poor as shown in the part (a) of FIG. 16. In this case, the detected correlation between height data Z and differential values ΔZ has a characteristic as shown in the part (b) of FIG. 16. The reference characters of the part (b) of FIG. 16 are similar to the reference characters of the part (c) of FIG. 15.

In FIG. 16, since the solder portion 2502 has large positive slopes and negative slopes, some of the measured data lie in the regions 2411 and 2412 while a small number of the measured data lie in the region 2410. Therefore, the count number outputted from the counter 2309 is high but the count number outputted from the counter 2307 is low. The decision device 116 judges the solder portion 2502 to be poor by the low count number and the high count number outputted from the counters 2307 and 2309 respectively.

DESCRIPTION OF THE SEVENTH PREFERRED EMBODIMENT

Figure 17:
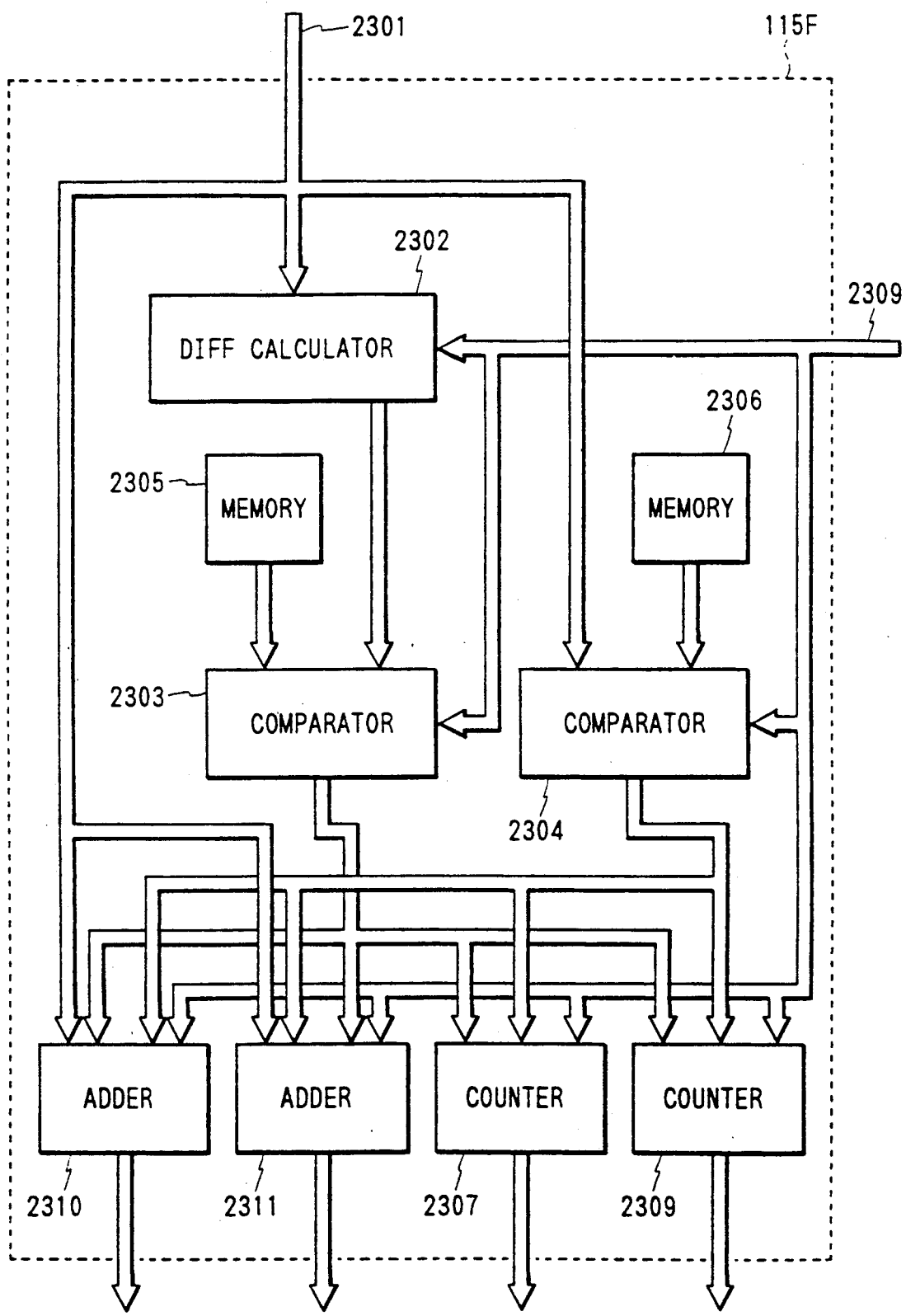
FIG. 17 is a block diagram of a calculator in an apparatus of a seventh embodiment of this invention.

FIG. 17 shows a seventh embodiment of this invention which is similar to the embodiment of FIGS. 14–16 except for the following design changes. In the embodiment of FIG. 17, a calculator 115F following an image processor 114 (see FIG. 1) includes accumulative adders 2310 and 2311 in addition to a differential calculator 2302, comparators 2303 and 2304, memories 2305 and 2306, and counters 2307 and 2309. The calculator 115F except the accumulative adders 2310 and 2311 is similar to the accumulative adder 115E of FIG. 14.

The accumulative adders 2310 and 2311 receive height data 2301 from an image processor 114 (see FIGS. 1 and 2), and serve to accumulatively add the height data 2301. The accumulative adders 2310 and 2311 also receive the output signals from the comparators 2303 and 2304. The accumulative adders 2310 and 2311 execute and suspend their adding functions in response to the output signals from the comparators 2303 and 2304. Specifically, the accumulative adder 2310 executes its adding function when both the output signals from the comparators 2303 and 2304 are "1", and the accumulative adder 2310 suspends its adding function otherwise. The accumulative adder 2311 executes its adding function when the output signals from the comparators 2303 and 2304 are "0" and "1" respectively, and the accumulative adder 2311 suspends its adding function otherwise.

The accumulative adders 2310 and 2311 also receive mask data 2309 from a memory 117 (see FIGS. 1 and 2). The accumulative adders 2310 and 2311 execute and suspend their operations in response to the mask data 2309. Specifically, in the case where the accumulative adders 2310 and 2311 are informed by the mask data 2309 that the currently processed signals correspond to solder portions, the accumulative adders 2310 and 2311 execute their operations. In the case where the currently processed signals correspond to the other portions, the accumulative adders 2310 and 2311 suspend their operations. Therefore, the height data 2310 are added by the accumulative adders 2310 and 2311 only for each of the solder portions.

As in the embodiment of FIGS. 14–16, in the case of a good solder portion, many of the measured data lie in a region 2410 (see FIG. 15) related to the accumulative adder 2310 while a small number of the measured data lie in regions 2411 and 2412 (see FIG. 15) related to the accumulative adder 2311. Therefore, in this case, the accumulative addition result outputted from the accumulative adder 2310 is significantly greater than 0 while the accumulative addition result outputted from the accumulative adder 2311 is close to 0.

As in the embodiment of FIGS. 14–16, in the case of a poor solder portion separating from related circuit parts, a small number of the measured data lie in the region 2410 (see FIG. 16) and some of the measured data lie in the regions 2411 and 2412 (see FIG. 16). Therefore, in this case, the accumulative addition result outputted from the accumulative adder 2310 is small but appreciably greater than 0 while the accumulative addition result outputted from the accumulative adder 2311 is much greater than 0.

The relation between the conditions of a solder portion and the accumulative addition results is used by a decision device 116 (see FIGS. 1 and 2) following the calculator 115F in deciding whether the solder portion is acceptable or unacceptable. Accordingly, the decision device 116 is modified to also evaluate both the output data from the accumulative adders 2310 and 2311. The evaluation includes comparison between the accumulative addition results with predetermined references. The added evaluated factors enable an increase in the reliability of this decision.

DESCRIPTION OF THE EIGHTH PREFERRED EMBODIMENT

Figure 18:
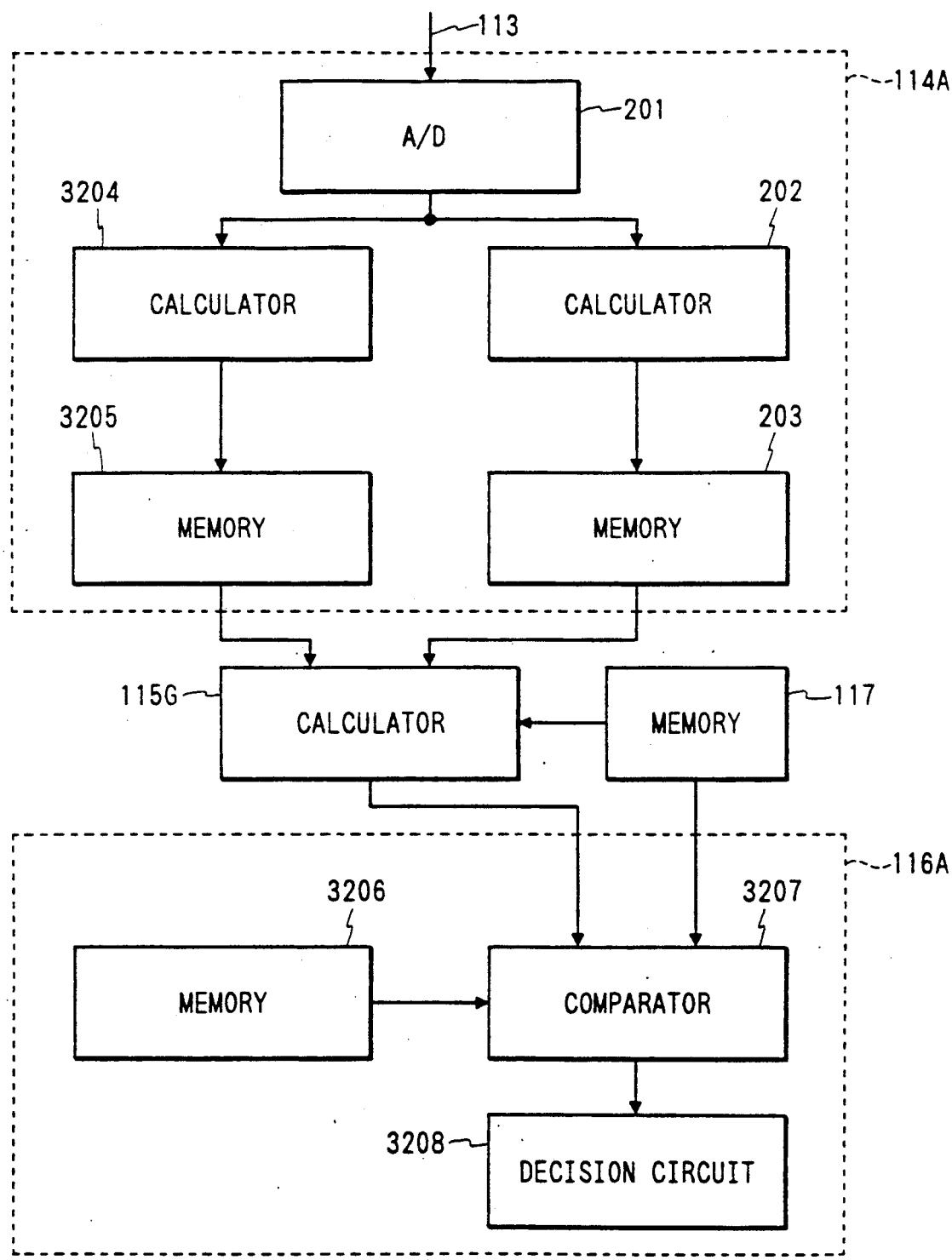
FIG. 18 is a block diagram of an electric signal processing part of an apparatus according to an eighth embodiment of this invention.
Figure 19:
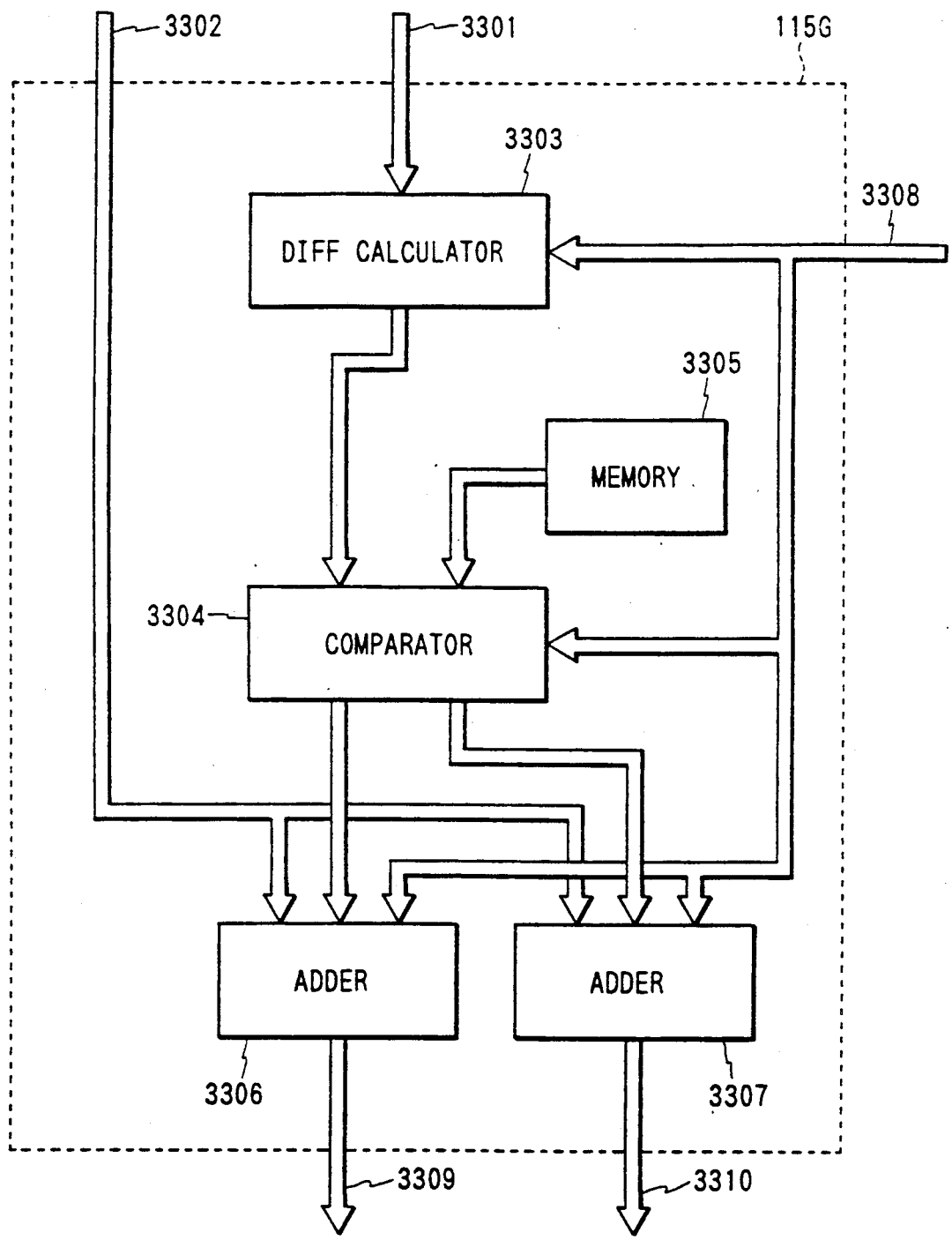
FIG. 19 is a block diagram of the calculator of FIG. 18.

FIGS. 18 and 19 show an eighth embodiment of this invention which is similar to the embodiment of FIGS. 1–4 except for the following design changes. In the embodiment of FIGS. 18 and 19, an image processor 114A following an optical position sensor 112 (see FIG. 1) includes calculator 3204 and a memory 3205 in addition to an A/D converter 201, a calculator 202, and a memory 203. The image processor 114A except the calculator 3204 and the memory 3205 is similar to the image processor 114 of FIGS. 1 and 2.

The calculator 3204 receives the digital position signal from the A/D converter 201. In the case where the optical position sensor 112 (see FIG. 1) is composed of the previously-mentioned position-sensitive detector, the digital position signal represents the currents I1 and I2. In this case, the calculator 202 calculates luminance data by referring to the following equation.

$$\text{Luminance Data} = I1 + I2 \qquad (2)$$

The luminance data are temporarily stored in the memory 3205 and are then outputted to a calculator 115G.

The calculator 115G receives height data from the memory 203. The calculator 115G receives predetermined mask data from a memory 117. As shown in FIG. 19, the calculator 115G includes a differential calculator 3303, a comparator 3304, a memory 3305, and accumulative adders 3306 and 3307.

The differential calculator 3303 calculates a time-dependent variation or a differential of height data 3301 fed from the image processor 114A, and outputs data representing the calculated differential. It is preferable that the calculated differential is defined in a direction from a solder portion toward related circuit parts. The differential data are fed from the differential calculator 3303 to the comparator 3304.

The comparator 3304 receives data from the memory 3305 which represent predetermined threshold values defining two ranges. The comparator 3304 receives the differential data from the differential calculator 3303 which represents the differential value. The comparator 3304 compares the differential value with the threshold values, and outputs signals which depend on the result of the comparison. The output signals from the comparator 3304 are fed to the accumulative adders 3306 and 3307 to control the accumulative adders 3306 and 3307 respectively.

The accumulative adder 3306 receives luminance data 3302 from the image processor 114A. The accumulative adder 3306 serves to accumulatively add the luminance data 3302. The accumulative adder 3306 executes and suspends its adding function in response to the output signal from the comparator 3304. When the differential value is greater than 0 but smaller than a predetermined positive threshold value A1, the output signal from the comparator 3304 enables the accumulative adder 3306 to execute its adding function. Otherwise, the output signal from the comparator 3304 forces the accumulative adder 3306 to suspend its adding function.

The accumulative adder 3307 receives the luminance data 3302 from the image processor 114A. The accumulative adder 3307 serves to accumulatively add the luminance data 3302. The accumulative adder 3307 executes and suspends its adding function in response to the output signal from the comparator 3304. When the differential value is negative and its absolute value is smaller than the absolute value of a predetermined negative threshold value A2, the output signal from the comparator 3304 enables the accumulative adder 3307 to execute its adding function. Otherwise, the output signal from the comparator 3304 forces the accumulative adder 3307 to suspend its adding function.

The differential calculator 3303, the comparator 3304, and the accumulative adders 3306 and 3307 receive the mask data 3308 from the memory 117. The differential calculator 3303, the comparator 3304, and the accumulative adders 3306 and 3307 execute and suspend their operations in response to the mask data 3308. Specifically, in the case where the devices 3303, 3304, 3306, and 3307 are informed by the mask data 3308 that the currently processed signals correspond to the solder portions, the devices 3303, 3304, 3306, and 3307 execute their calculating processes. In the case where the currently processed signals correspond to the other portions, the devices 3303, 3304, 3306, and 3307 suspend their calculating processes. Accordingly, for each of the solder portions, the accumulative adders 3306 and 3307 output data 3309 and 3310 representing the results of the accumulative additions respectively. The accumulative addition results 3309 and 3310 are outputted to a decision device 116A.

The decision device 116A includes a memory 3206, a comparator 3207, and a decision circuit 3208. The comparator 3207 receives the output data from the calculator 115G which represent the accumulative addition results 3309 and 3310. The comparator 3207 also receives the predetermined reference data from the memory 3206 which represent desired luminance sums for the respective solder portions. For each of the solder portions, the comparator 3207 compares the accumulative addition results with the predetermined reference data, and generates comparison data representing the difference between the accumulative addition results and the predetermined reference data. The comparator 3207 receives the mask data from the memory 117. The comparator 3207 uses the mask data in executing the comparing process for each of the solder portions and suspending the comparing process for the other portions. The decision circuit 3208 receives the comparison data from the comparator 3207. For each of the solder portions, the decision circuit 3208 decides whether conditions of the solder portion are acceptable or unacceptable on the basis of the difference between the accumulative addition results and the predetermined reference data which is represented by the comparison data. The result of the decision by the decision circuit 3208 is indicated by a suitable device (not shown).

In the case of a good solder portion, since the slope of the surface of the solder portion essentially continues to be positive in a direction toward related circuit parts, the accumulative addition result 3309 outputted from the accumulative adder 3309 is large while the accumulative addition result 3310 is close to 0. In the case of a poor solder portion which separates from related circuit parts, since the slope of the surface of the solder portion starts is positive firstly and is negative secondly in a direction toward the related circuit parts, both of the accumulative addition results 3309 and 3310 are significantly larger than 0. These conditions of the accumulative addition results 3309 and 3310 which depend on the goodness and poorness of solder portions are used by the decision device 116A in deciding whether the solder portions are acceptable or unacceptable.

DESCRIPTION OF THE NINTH PREFERRED EMBODIMENT

Figure 20:
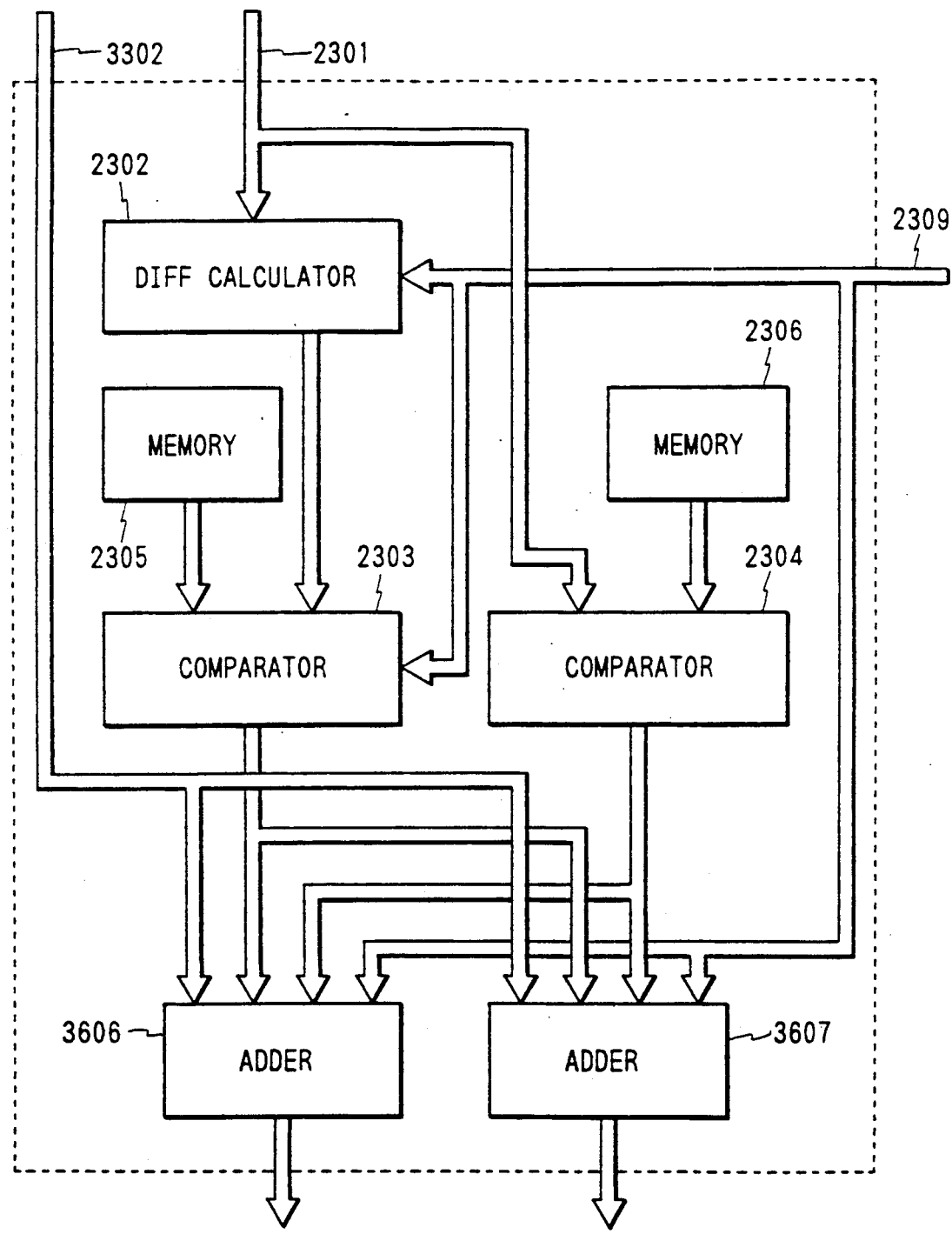
FIG. 20 is a block diagram of a calculator in an apparatus of a ninth embodiment of this invention.

FIG. 20 shows a ninth embodiment of this invention which is similar to the embodiment of FIGS. 18 and 19 except for the following design changes. A calculator 115H of the embodiment of FIG. 20 is similar to the calculator 115F of FIG. 17 except that the counters 2307 and 2308 are omitted and that the accumulative adders 2310 and 2311 are replaced by accumulative adders 3606 and 3607.

The accumulative adders 3606 and 3607 receive luminance data 3302 from an image processor 114A (see FIG. 18), and serve to accumulatively add the luminance data 3302. The accumulative adders 3606 and 3607 also receive the output signals from comparators 2303 and 2304. The accumulative adders 3606 and 3607 execute and suspend their adding functions in response to the output signals from the comparators 2303 and 2304. Specifically, the accumulative adder 3606 executes its adding function when both the output signals from the comparators 2303 and 2304 are "1", and the accumulative adder 3606 suspends its adding function otherwise. The accumulative adder 3607 executes its adding function when the output signals from the comparators 2303 and 2304 are "0" and "1" respectively, and the accumulative adder 3607 suspends its adding function otherwise.

The accumulative adders 3606 and 3607 also receive mask data 2309 from a memory 117 (see FIG. 18). The accumulative adders 3606 and 3607 execute and suspend their operations in response to the mask data 2309. Specifically, in the case where the accumulative adders 3606 and 3607 are informed by the mask data 2309 that the currently processed signals correspond to solder portions, the accumulative adders 3606 and 3607 execute their operations. In the case where the currently processed signals correspond to the other portions, the accumulative adders 3606 and 3607 suspend their operations. Therefore, the luminance data 3302 are added by the accumulative adders 3606 and 3607 only for each of the solder portions.

As in the embodiment of FIGS. 14-16, in the case of a good solder portion, many of the measured data lie in a region 2410 (see FIG. 15) related to the accumulative adder 3606 while a small number of the measured data lie in regions 2411 and 2412 (see FIG. 15) related to the accumulative adder 3607. Therefore, in this case, the accumulative addition result outputted from the accumulative adder 3606 is significantly greater than 0 while the accumulative addition result outputted from the accumulative adder 3607 is close to 0.

As in the embodiment of FIGS. 14-16, in the case of a poor solder portion separating from related circuit parts, a small number of the measured data lie in the region 2410 (see FIG. 16) and also some of the measured data lie in the regions 2411 and 2412 (see FIG. 16). Therefore, in this case, the accumulative addition result outputted from the accumulative adder 3607 is small but appreciably larger than 0 while the accumulative addition result outputted from the accumulative adder 3608 is much greater than 0.

The relation between the conditions of a solder portion and the accumulative addition results is used by a decision device 116A (see FIG. 18) following the calculator 115H in deciding whether the solder portion is acceptable or unacceptable. Specifically, the decision device 116A (see FIG. 18) executes comparison between the accumulative addition results and predetermined references for the deciding process.

What is claimed is:

1. An apparatus for inspecting a circuit board provided with at least one solder portion, the apparatus comprising:

means for emitting a beam of light;
means for applying the light beam to a surface of the circuit board;
means for allowing the light beam to scan the surface of the circuit board;
means for deriving height data from a portion of the light beam which is scattered at the surface of the circuit board, the height data representing a height of a currently-scanned point of the surface of the circuit board;
means for accumulatively adding the height data for the solder portion;
means for calculating a variation in the height data;
means for executing and suspending the accumulatively adding by the adding means in response to the calculated variation in the height data; and
means for deciding whether the solder portion is acceptable or unacceptable on the basis of a result of the accumulatively adding by the adding means.

2. The apparatus of claim 1 further comprising means for averaging the height data to generate average height data, and means for feeding the average height data to the adding means and the variation calculating means.

3. An apparatus for inspecting a circuit board provided with at least one solder portion, the apparatus comprising:

means for emitting a beam of light;
means for applying the light beam to a surface of the circuit board;
means for allowing the light beam to scan the surface of the circuit board;
means for deriving height data from a portion of the light beam which is scattered at the surface of the circuit board, the height data representing a height of a currently-scanned point of the surface of the circuit board;
means for calculating a differential of the height data for the solder portion; and
means for deciding whether the solder portion is acceptable or unacceptable on the basis of the calculated differential of the height data.

4. The apparatus of claim 3 wherein the deciding means comprises means for accumulatively adding the calculated differential of the height data, and means for deciding whether or not the solder portion is acceptable or unacceptable on the basis of a result of the accumulative adding by the adding means.

5. The apparatus of claim 3 wherein the deciding means comprises means for detecting a maximum and a minimum of the calculated differential of the height data, means for comparing the calculated differential of the height data with a predetermined reference region, means responsive to a result of the comparing for generating count data representing a number of times the calculated differential lies in the predetermined reference region, and means for deciding whether or not the solder portion is acceptable or unacceptable on the basis of the detected maximum, the detected minimum, and the count data.

6. An apparatus for inspecting a circuit board provided with at least one solder portion, the apparatus comprising:

means for emitting a beam of light;
means for applying the light beam to a surface of the circuit board;
means for allowing the light beam to scan the surface of the circuit board;
means for deriving height data from a portion of the light beam which is scattered at the surface of the circuit board, the height data representing a height of a currently-scanned point of the surface of the circuit board;
means for calculating a differential of the height data, and generating differential data representing the calculated differential of the height data, wherein differential data and corresponding height data compose general data;
means for calculating a first number of the general data lying in a predetermined acceptable two-dimensional region for the solder portion, the acceptable region being defined by a first predetermined height range and a first predetermined differential range;
means for calculating a second number of the general data lying in a predetermined unacceptable two-dimensional region for the solder portion, the unacceptable region being defined by a second predetermined height range and a second predetermined differential range; and
means for deciding whether the solder portion is acceptable or unacceptable on the basis of the calculated first and second numbers.

7. An apparatus for inspecting a circuit board provided with at least one solder portion, the apparatus comprising:

means for emitting a beam of light;
means for applying the light beam to a surface of the circuit board;
means for allowing the light beam to scan the surface of the circuit board;

means for deriving height data from a portion of the light beam which is scattered at the surface of the circuit board, the height data representing a height of a currently-scanned point of the surface of the circuit board;

means for calculating a differential of the height data, and generating differential data representing the calculated differential of the height data, wherein differential data and corresponding height data compose general data;

means for calculating a first number of the general data lying in a predetermined acceptable two-dimensional region for the solder portion, the acceptable region being defined by a first predetermined height range and a first predetermined differential range;

means for calculating a second number of the general data lying in a predetermined unacceptable two-dimensional region for the solder portion, the unacceptable region being defined by a second predetermined height range and a second predetermined differential range;

first adding means for accumulatively adding the height data corresponding to general data lying in the acceptable region;

second adding means for accumulatively adding the height data corresponding to general data lying in the unacceptable region; and means for deciding whether the solder portion is acceptable or unacceptable on the basis of the calculated first and second numbers, and results of the accumulatively adding by the first and second adding means.

8. An apparatus for inspecting a circuit board provided with at least one solder portion, the apparatus comprising:

means for emitting a beam of light;

means for applying the light beam to a surface of the circuit board;

means for allowing the light beam to scan the surface of the circuit board;

means for deriving height data from a portion of the light beam which is scattered at the surface of the circuit board, the height data representing a height of a currently-scanned point of the surface of the circuit board;

means for deriving luminance data from a portion of the light beam which is scattered at the surface of the circuit board, the luminance data representing a luminance of a currently-scanned point of the surface of the circuit board;

means for accumulatively adding the luminance data for the solder portion;

means for calculating a variation in the height data;

means for executing and suspending the accumulatively adding by the adding means in response to the calculated variation in the height data; and means for deciding whether the solder portion is acceptable or unacceptable on the basis of a result of the accumulatively adding by the adding means.

9. An apparatus for inspecting a circuit board provided with at least one solder portion, the apparatus comprising:

means for emitting a beam of light;

means for applying the light beam to a surface of the circuit board;

means for allowing the light beam to scan the surface of the circuit board;

means for deriving height data from a portion of the light beam which is scattered at the surface of the circuit board, the height data representing a height of a currently-scanned point of the surface of the circuit board;

means for calculating a differential of the height data, and generating differential data representing the calculated differential of the height data, wherein differential data and corresponding height data compose general data;

first detecting means for detecting the general data which lies in a predetermined acceptable two-dimensional region, the acceptable region being defined by a first predetermined height range and a first predetermined differential range;

second detecting means for detecting the general data which lies in a predetermined unacceptable two-dimensional region, the unacceptable region being defined by a second predetermined height range and a second predetermined differential range;

first adding means responsive to the first detecting means for accumulatively adding the luminance data corresponding to general data lying in the acceptable region for the solder portion;

second adding means responsive to the second detecting means for accumulatively adding the luminance data corresponding to general data lying in the unacceptable region for the solder portion; and means for deciding whether the solder portion is acceptable or unacceptable on the basis of results of the accumulatively adding by the first adding means and the second adding means.

* * * * *